United States Patent [19]

Zrudsky

[11] 3,995,174

[45] Nov. 30, 1976

[54] CHOPPER AND CHOPPER-MULTIPLEXER CIRCUITRY FOR MEASUREMENT OF REMOTE LOW-LEVEL SIGNALS

[75] Inventor: Donald R. Zrudsky, Sylvania, Ohio

[73] Assignee: The University of Toledo, Toledo, Ohio

[22] Filed: Feb. 3, 1975

[21] Appl. No.: 546,700

Related U.S. Application Data

[63] Continuation-in-part of Ser. No. 445,929, Feb. 26, 1974, abandoned.

[52] U.S. Cl. ............................... 307/240; 307/251; 307/311; 321/45 R; 332/27; 357/75

[51] Int. Cl.² ................. H03K 17/60; H02M 7/537; H03K 3/42

[58] Field of Search ........... 307/240, 251, 311, 260, 307/261; 321/44, 45 R; 357/75; 330/10; 332/27

[56] References Cited

UNITED STATES PATENTS

| | | | |
|---|---|---|---|
| 3,191,115 | 6/1965 | Lloyd | 321/45 R |
| 3,397,353 | 8/1968 | Hitt et al. | 307/251 X |
| 3,466,557 | 9/1969 | Nazareth, Jr. | 307/240 X |
| 3,582,762 | 6/1971 | Mori et al. | 357/75 X |
| 3,612,903 | 10/1971 | Lynn et al. | 307/251 |
| 3,705,355 | 12/1972 | Palmer et al. | 307/251 X |

*Primary Examiner*—John S. Heyman
*Assistant Examiner*—Larry N. Anagnos
*Attorney, Agent, or Firm*—Oliver E. Todd, Jr.

[57] ABSTRACT

A balanced bridge chopper circuit including four metal oxide semiconductor field effect transistors (MOSFETs) is driven by a remote oscillator connected through an isolator to modulate low-voltage low-frequency input signals at their remote source into a square wave A.C. output signal that can be conducted to a common point where it is amplified and demodulated for better linear measurement of said low-voltage signals. The oscillator is connected through the isolator to the bridge circuit in such a manner that opposing pairs of the bridge transistors are simultaneously conducting. The isolator may comprise a novel photovoltaic isolation device or it may consist of an isolation transformer or of other types of electrical isolation devices. The transistors and input and output terminals for the bridge circuit are shielded and are mounted on a heat sink consisting of a thermally conducting metal plate and/or a metal oxide single crystal which is in common with the shield and/or one terminal of the low-voltage source such that all leads and terminals are maintained at a constant temperature and preferably at the same temperature as the low-voltage source. Air currents are prevented from causing thermally induced voltages within the bridge circuit by the circuit shield and in some extreme cases by the use of a hermetically sealed shield for the critical circuit elements and connections. For accurately balancing out interelectrode capacitance-coupled gate drive to low-level channel signals, a pair of variable capacitors are connected between one output terminal of the bridge circuit and the gate of each of its two adjacent transistors. The balanced bridge chopper may be produced as a monolithic planar-silicon integrated circuit in which gate-to-channel capacitance balancing is accomplished during manufacturing in place of the variable capacitors. A novel balanced input filter and trimmer capacitors between the bridge output terminals and local ground greatly reduce 60 Hz. common mode noise. In a hybrid circuit embodiment of the bridge circuit, the individual MOSFET chips forming the bridge circuit are bonded and interconnected within a hermetically sealed and magnetically transparent metal oxide single crystalline container. Multiplexing circuitry is also disclosed for driving several chopper circuits from a single oscillator and for connecting the outputs from the chopper circuits to a single amplifier and demodulator at a remote location.

16 Claims, 20 Drawing Figures

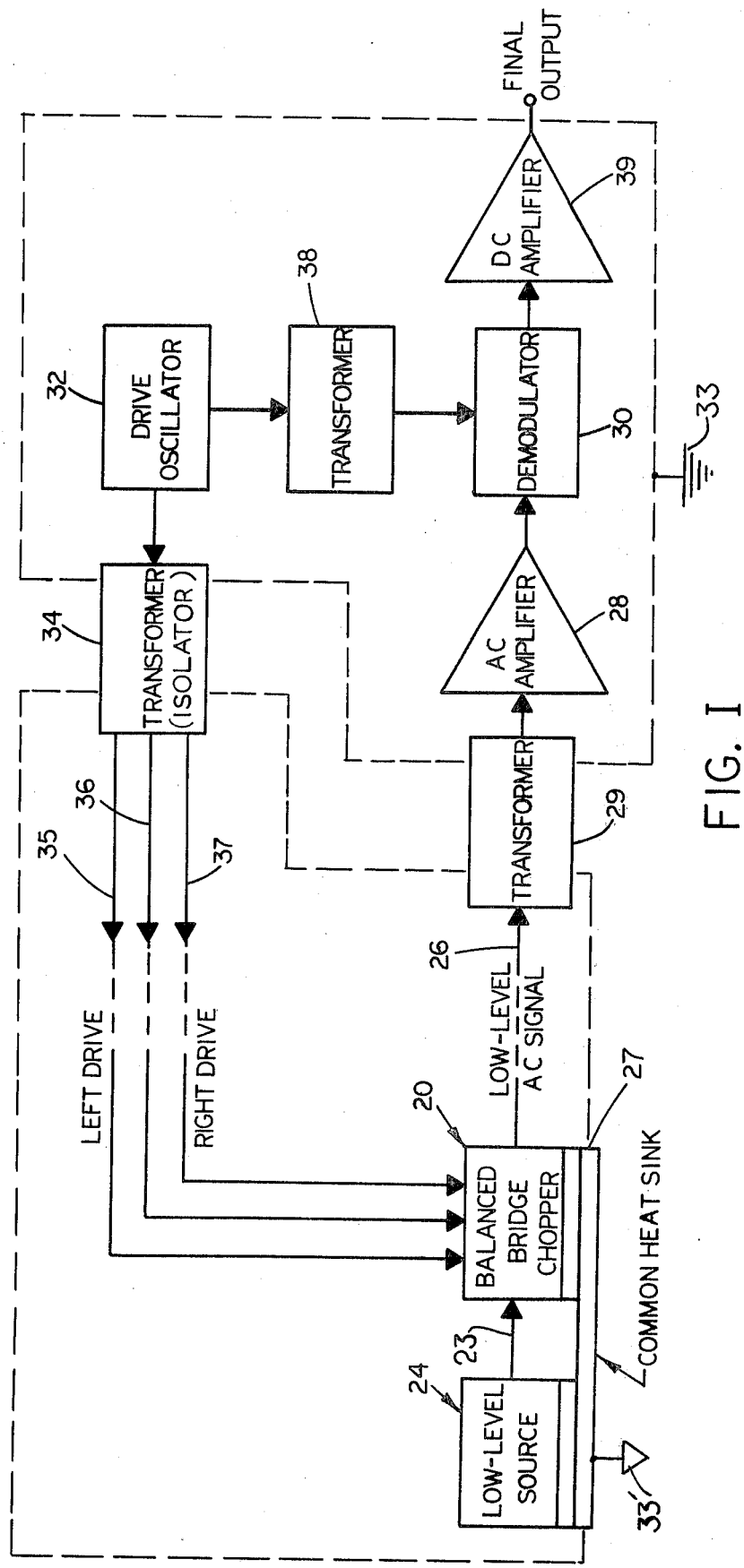
FIG. I

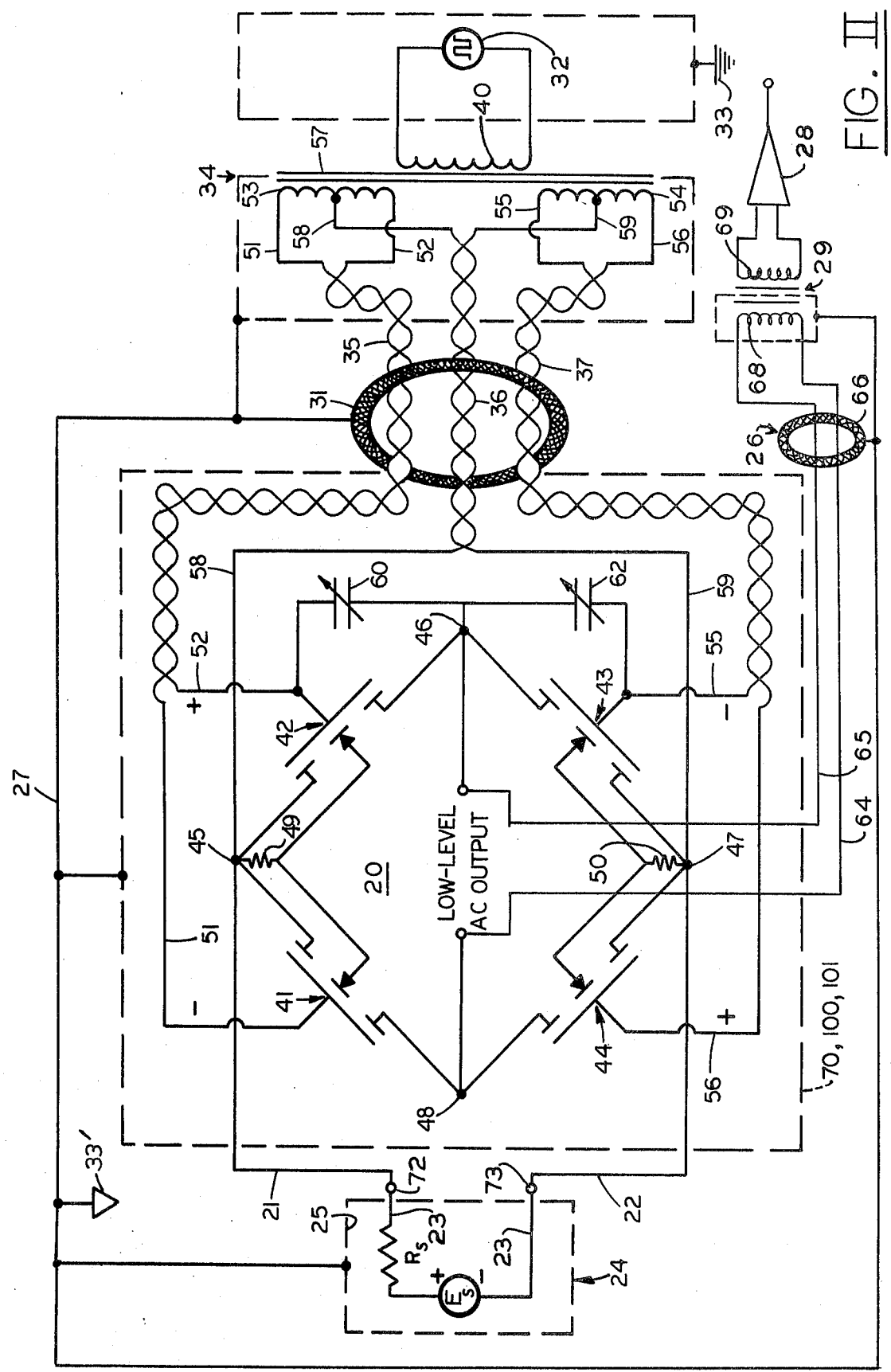
FIG. II

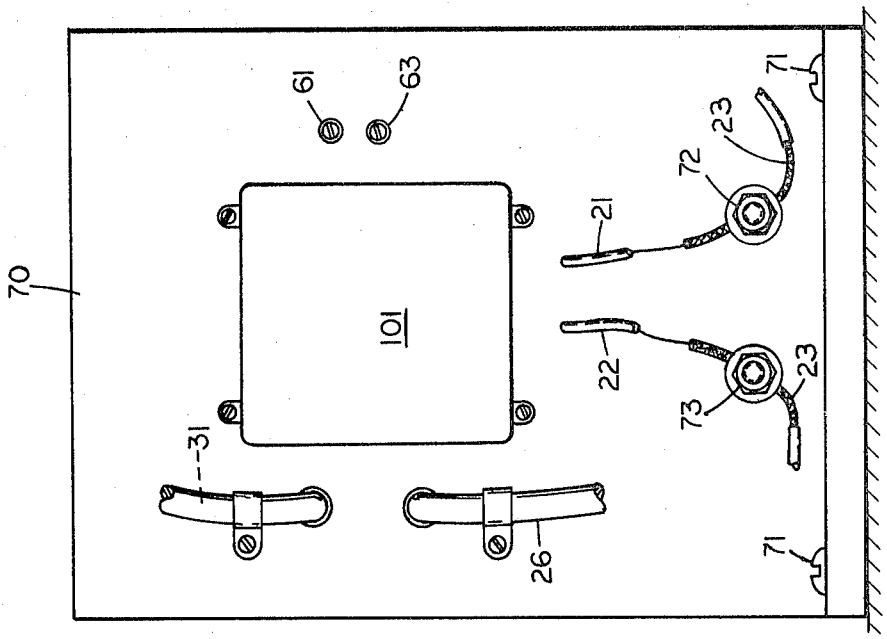
FIG. V
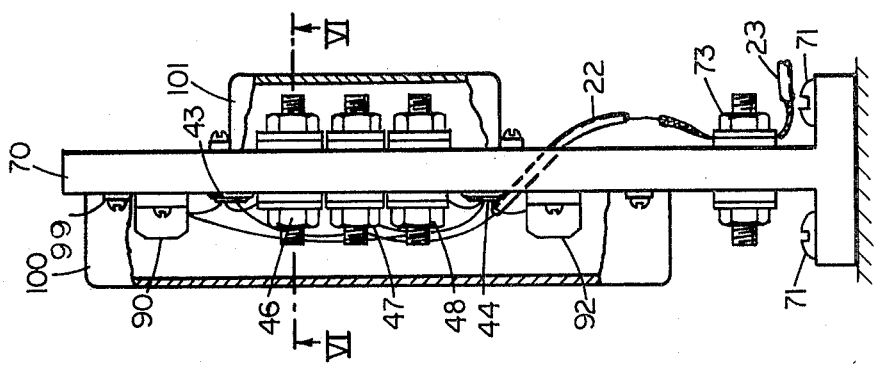
FIG. IV
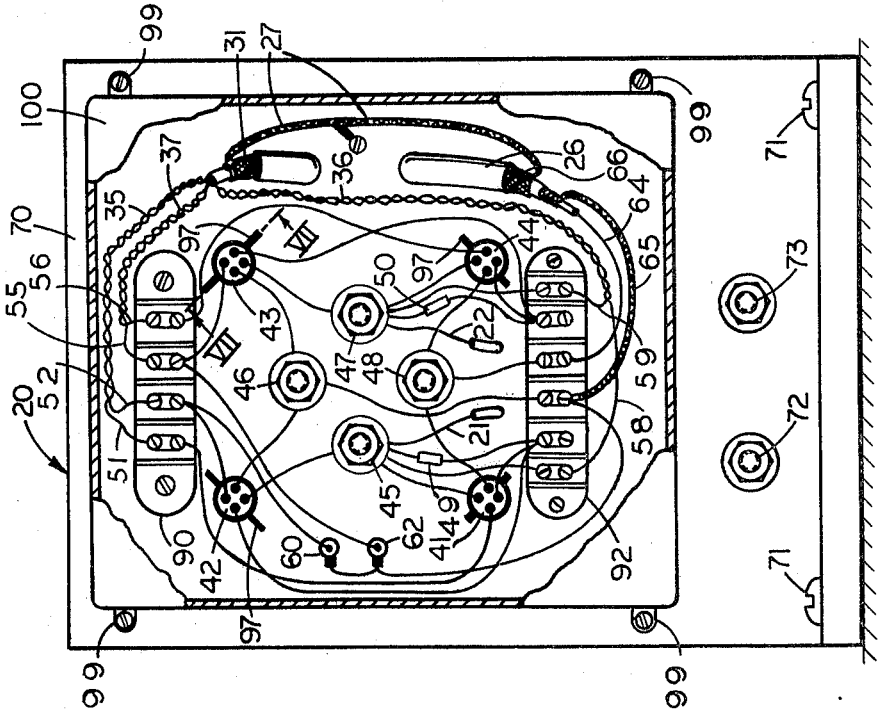
FIG. III

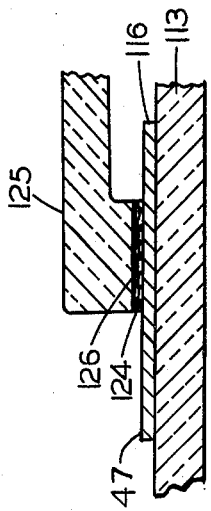
FIG. XI
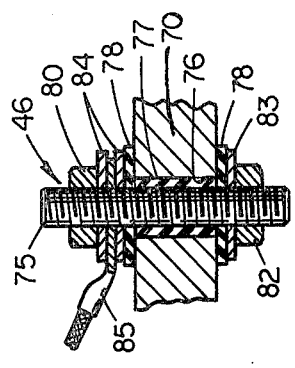
FIG. VI
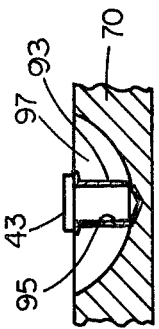
FIG. VII
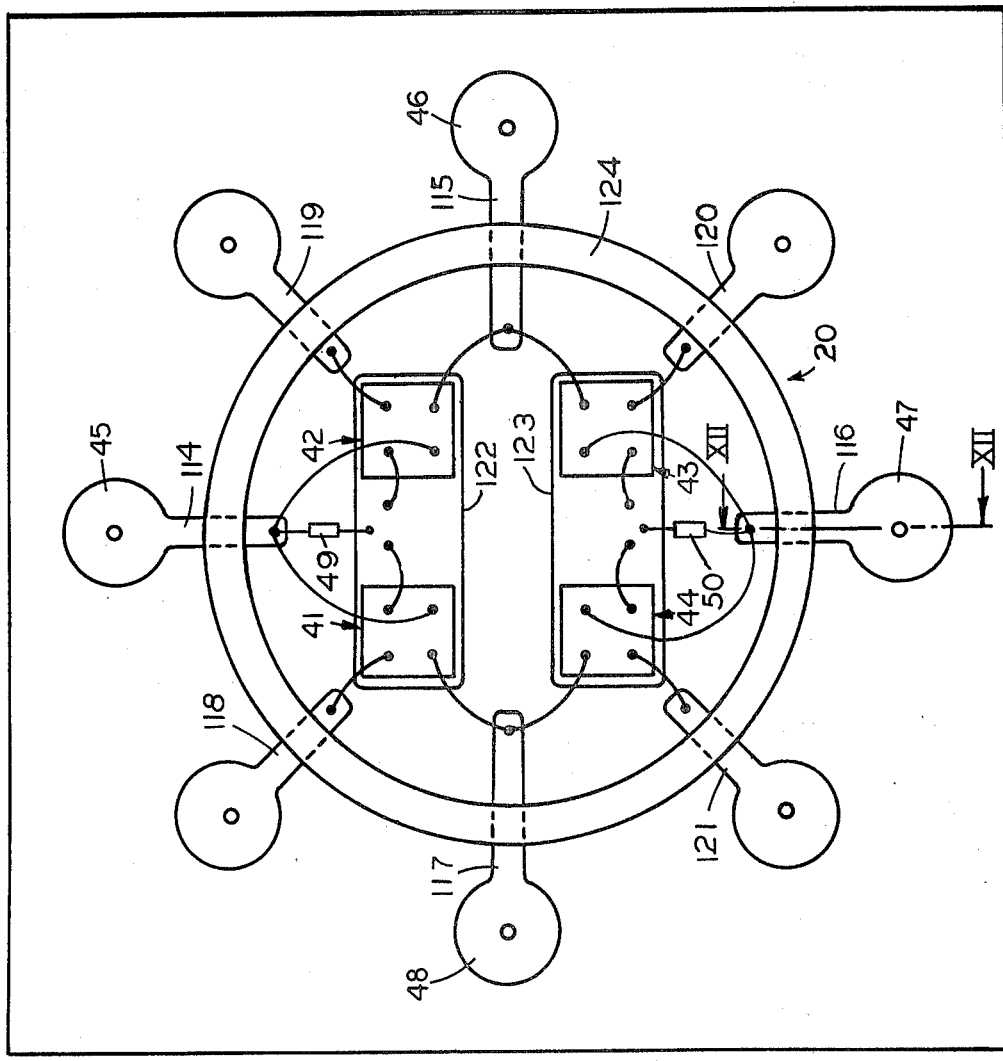
FIG. XI

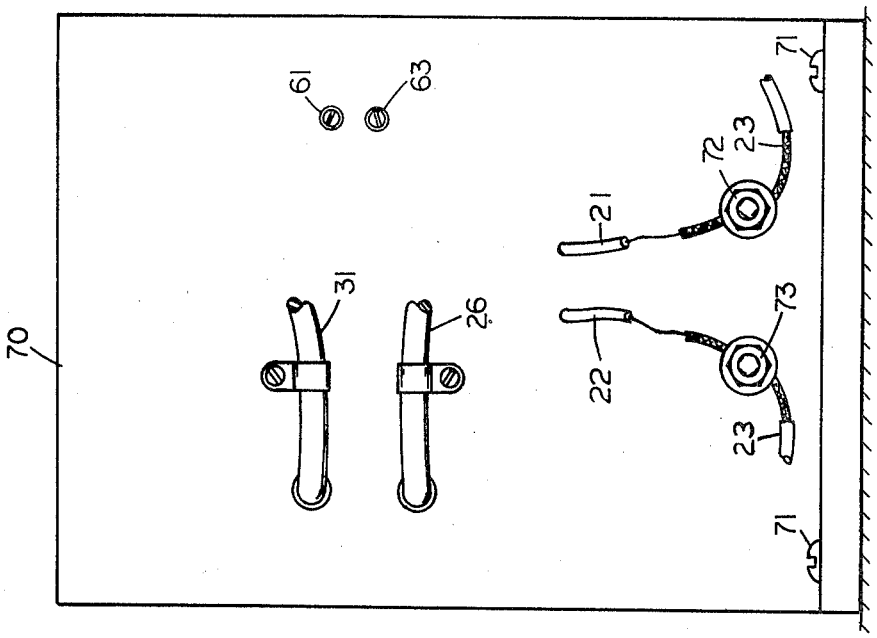
FIG. X
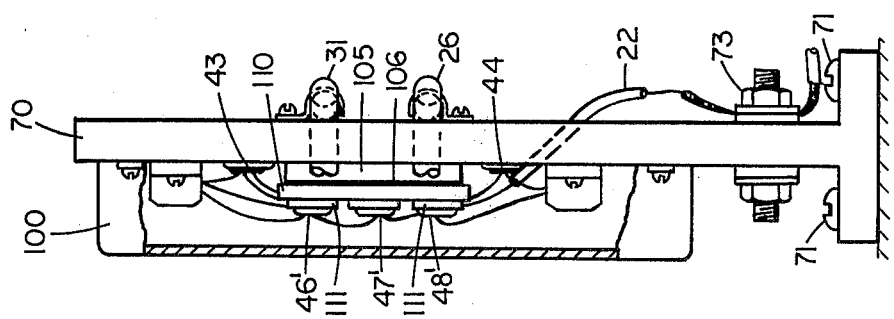
FIG. IX
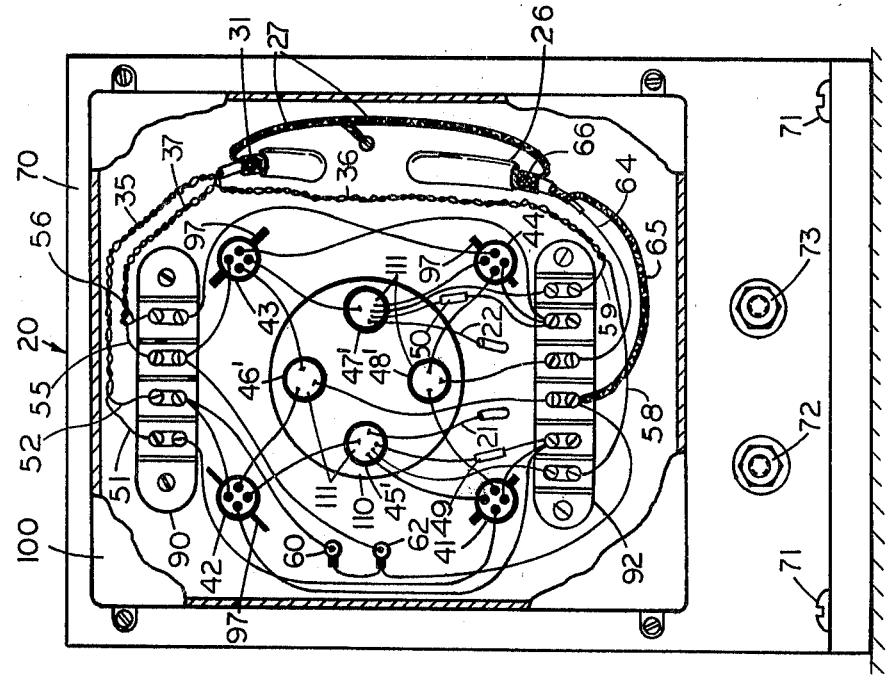
FIG. VIII

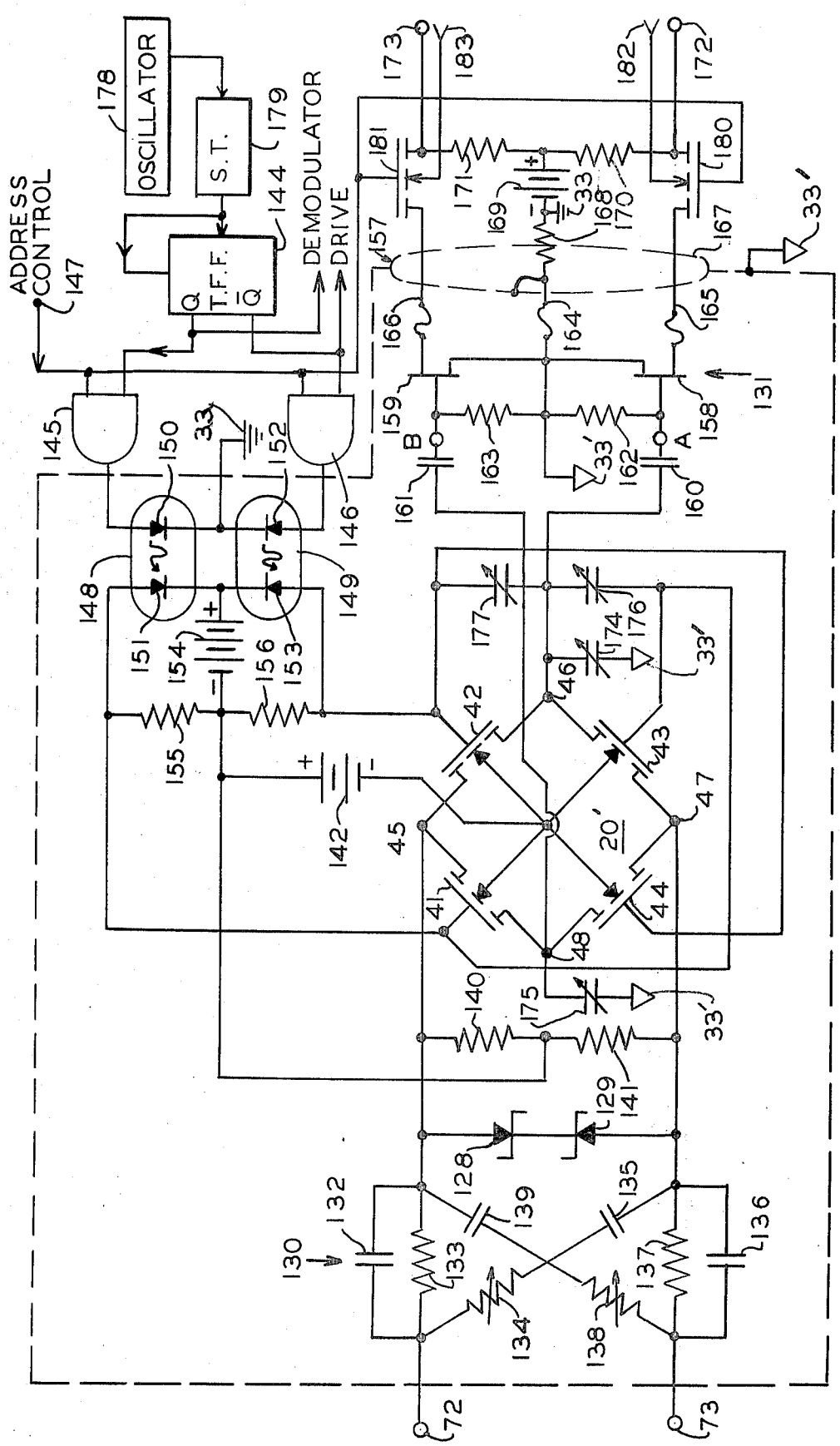
FIG. XIII

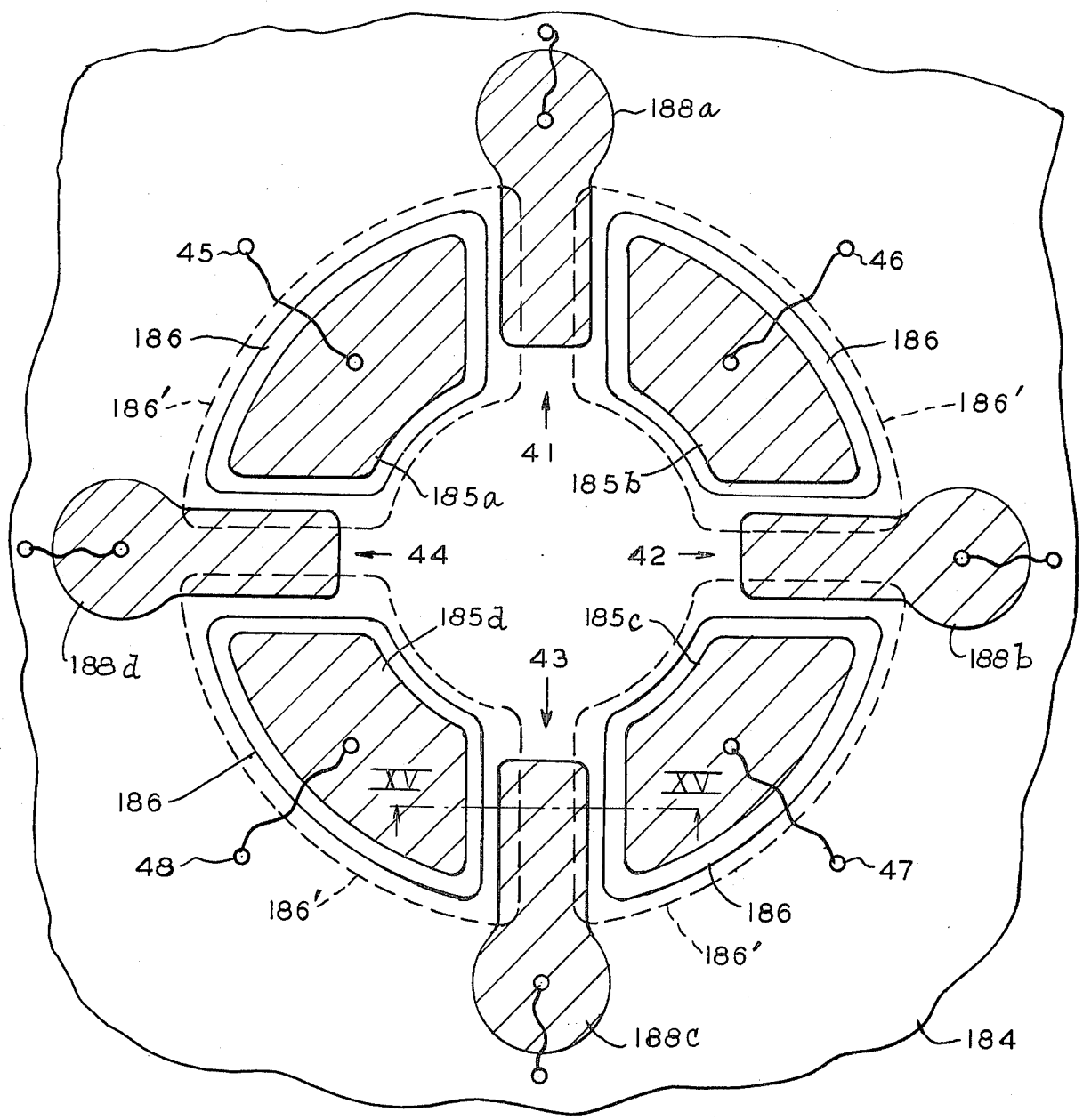
FIG. XIV
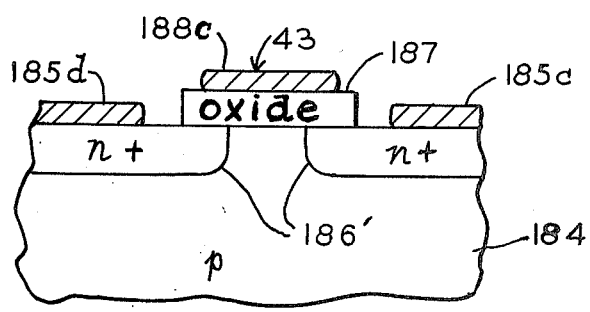
FIG. XV

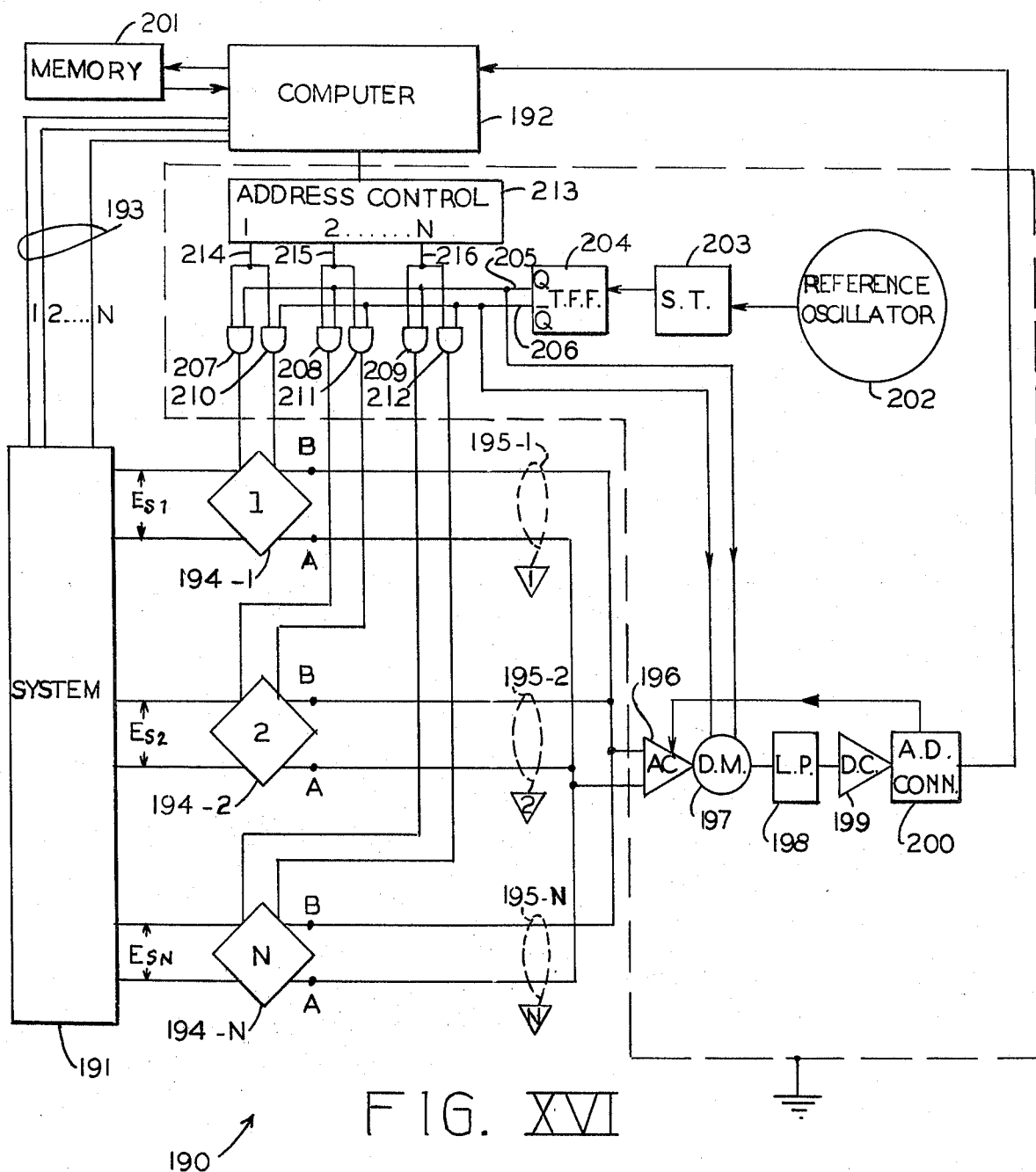
FIG. XVI

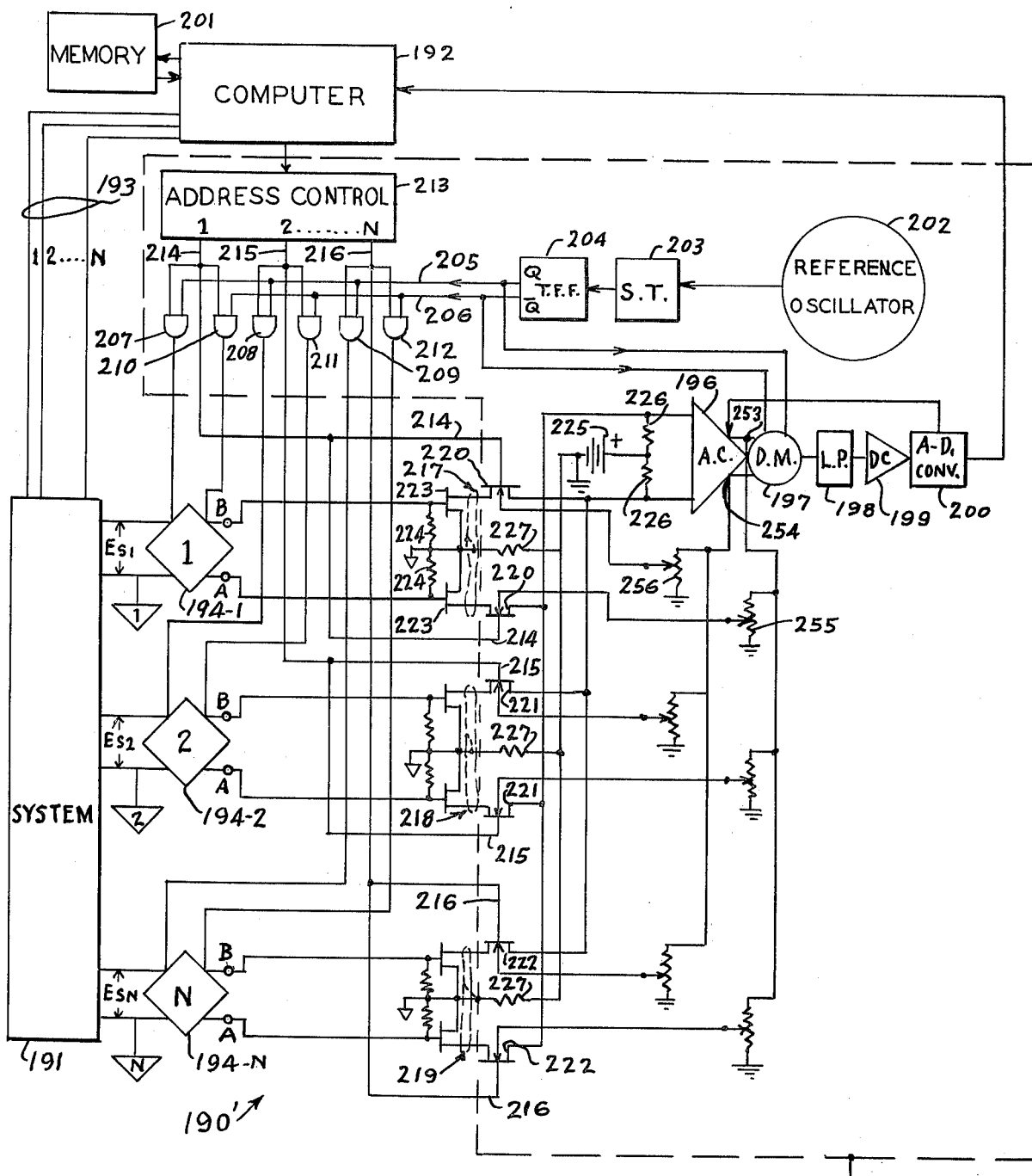
FIG. XVII

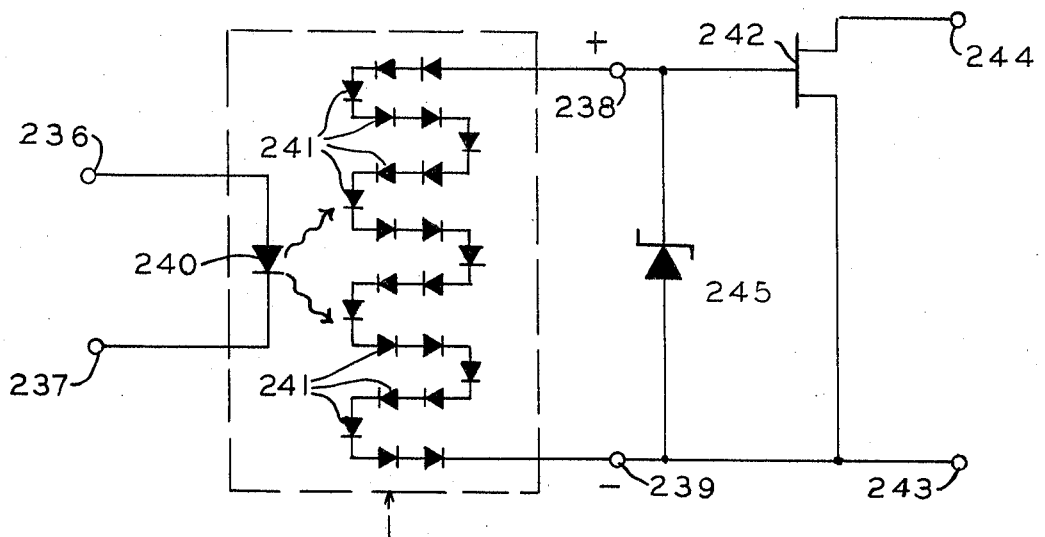
FIG. XVIII
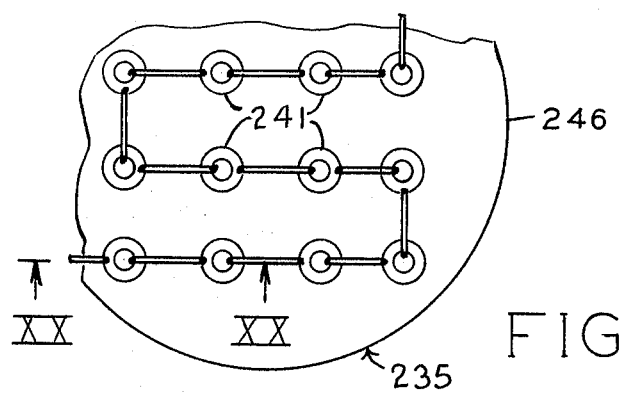
FIG. XIX
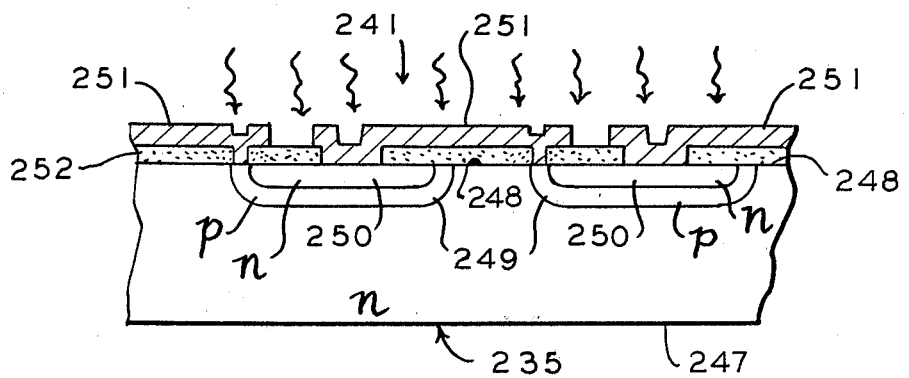
FIG. XX

CHOPPER AND CHOPPER-MULTIPLEXER CIRCUITRY FOR MEASUREMENT OF REMOTE LOW-LEVEL SIGNALS

CROSS-REFERENCE TO RELATED PATENT APPLICATIONS

This is a continuation-in-part of my copending patent application Ser. No. 445,929, filed Feb. 26, 1974 and now abandoned.

BACKGROUND OF THE INVENTION

In the instrumentation, control and related arts, it is often desirable to connect a remote voltage source to a distant point for measurement or control purposes. For example, thermocouples are generally located many feet from a temperature indicating meter. Similarly, other transducers and sensor type voltage sources are often remotely spaced from indicating or control circuitry which is responsive to a sensed condition. In the past, noise considerations have generally necessitated that the voltage source generate a voltage on at least the millivolt level for reliable information transfer with a remote instrument or other receiver.

Previously, low-voltage, low-frequency signals, particularly those in the microvolt to nanovolt range, have been very difficult and often impossible to measure because the signals to be measured were indistinguishable from noise which was both generated within and induced into the system. One major noise source has been found to be a common mode voltage appearing between the "local ground" at the remote low-level voltage source and the "reference ground" at the distant meter, instrument or other receiver. The low-level voltage source is either directly connected to the local ground or effectively connected to the local ground through leakage resisitances and leakage capacitances which result from the physical support of the source at local ground as well as the proximity of nearby objects. These values can have an enormously wide range of possibilities, depending in detail on the nature of the source and the specific point of application. Here the source could be a thermocouple, pH electrode or several other common transducers, whereas local ground could be a furnace, machine, or even a human patient. By the nature of any local ground, composed of heavy base metal plates, wires, supporting fixtures, etc., and the fact that rotating machinery, power using equipment and power cables could be in the general vicinity, at least in most industrial or laboratory environments, it is common to find a sizable potential difference between local ground and reference ground. This potential difference, which is predominately steady state 60 Hz. of up to 1 volt, could under some special cases consist of transients of several hundred volt magnitudes lasting up to a few milliseconds in time.

Where the remote low-level voltage source is connected to a distant meter by a wire, magnetically induced voltages may also occur in the system. This noise source is produced by magnetic flux changes over a period of time. Mechanical motion of charged objects near the low-level voltage source and all along the wire connected to the meter also produce noise transients in the system. The most common form of such "charge sources" are humans, often with at least one meter operator involved. Depending on humidity conditions, a single human being can act typically as a one microfarad capacitor to ground, charged to several thousand volts potential. It is not necessary that humans or other objects actually touch either the wire or immediate fixtures, inasmuch as relative motion causes their distributed capacitance to change sufficiently in time to cause signiificant transient current to flow in the circuit.

Still another important noise source is galvanomagnetic voltage sources, the principal source of which is the phenomenon of thermoelectricity. These sources are principally D.C. in nature, but can have components of time change representable by thermal time constants associated with the thermal mass and thermal insulation of the connecting wire or circuit involved. Because, in general, the source and meter are at different temperatures, each electrical connection acts as an individual thermocouple wire generating a distributed voltage within itself.

Remote sensing of sub-microvolt level signals at near D.C. frequencies can be seen as being most severely limited by two effects: (1) thermoelectric voltage instability on the signal lines, especially under severe temperature gradient conditions, and (2) inability to remove one end of the source from local ground. These are the main reasons why sub-microvolt level measurements are seldom attempted for remote applications, even with the most advanced state of the art equipment.

One prior art method for increasing the reliability of low-level signal transmission systems involves modulating the low-level D.C. or low-frequency A.C. signal at the common meter input with a chopper circuit. The chopper converts the low-level voltage at the source into an alternating current signal of a higher frequency and of substantially a square wave form. Hitt et al. U.S. Pat. Nos. 3,397,353, issued Aug. 13, 1968, and No. 3,585,518, issued June 15, 1971, teach the use of field effect transistors in a chopper array which is non-symmetrical with respect to common or ground. The chopper utilizes a single balancing capacitor and/or a special transformer to aid in reduction of chopper drive signal to low-level channel coupling. This non-symmetrical array and/or need for a costly balancing transformer limits the complete and economical solution for drive signal coupling problems.

Banasiewicz et al. U.S. Pat. No. 3,621,474, issued Nov. 16, 1971, teaches a modulator or chopper using a balanced bridge configuration of field effect transistors (FETs) in obtaining the modulation of a carrier signal with a source signal. This technique of impressing the source signal on the gates of the transistors prevents complete source signal chopping from occurring, which is incompatible with low-level signal modulation, amplification and demodulation measuring techniques.

Lynn et al. U.S. Pat. No. 3,612,903, issued Oct. 12, 1971, teaches the use of a balanced bridge field effect transistor chopper circuit ot moderate low-level signal capability. The use of junction field effect transistors (JFETs) in the legs of the bridge is a serious limitation, permitting gate drive leakage current to reach the low-level channel. JFETs also require the added use of transformer secondary circuit diodes and discharge resistors that add to the cost and add a potentially troublesome reduction in circuit reliability. The use of series resistors and an adjustable resistor in the low-level channel add cost increases to the chopper and add thermal voltage sources into the low-level channel, a further noise source. Their use of resistor balancing for capacitor coupled gate signal to low-level channel balancing makes the balance condition frequency dependent. Failure to provide heat sinks or other thermal stabilizing influences on this circuitry permits internally generated voltages to limit the Lynn et al. chopper to the microvolt or higher voltage ranges.

The above and other prior art chopper circuits have been limited in applications involving very low-level signals due to troublesome noise which generally results from two sources. One is the thermoelectrically caused low-frequency noise resulting from inadequate thermal stabilization of circuit elements and junctions. The other is large common mode signal sources which become incorporated into the signal channel of most priot art chopper circuits by the nature of their non-symmetrical relation to ground. The circuits of the present invention directly address these problems and consequently offer significant improvements over the prior low-level signal processing art.

SUMMARY OF THE INVENTION

Generally speaking, the present invention involves the modulation of low-voltage signals, ranging from about one nanovolt to about one volt and in frequency from D.C. to low audio frequency, into a square wave signal of audio frequency or higher. Modulation is effected by a simple balanced bridge chopping circuit of four insulated gate field effect transistors (IGFETs), preferably of the metal oxide semiconductor field effect transistor type, hereinafter referred to as MOSFETs, which are physically mounted on a heat sink and are shielded from temperature gradients and/or air currents. The bridge circuit is located physically adjacent and heat sinked to the source voltage, which is located remote from and isolated from its driving square wave source so as to prevent as much as possible drive signal coupling to the low-level channel. Also, the MOSFETs which form the bridge circuit are capacitively balanced. In one embodiment of the chopper, the square wave driving source is isolated from the bridge circuit by a driving transformer which has two center tapped secondary coils which are so connected by twisted and shielded pairs of leads to each MOSFET as to minimize magnetic flux coupling and to prevent drive voltage capacitance pickup in the bridge circuit while simultaneously causing the opposing MOSFETs in the bridge circuit to conduct in alternating or chopping fashion. In a significantly modified embodiment, either a prior art optical isolation device combined with a D.C. voltage source or a light emitting diode (LED)-photo-voltaic diode array provides optical isolation between the square wave driving source and the MOSFETs in the bridge circuit. Both isolator embodiments provide a high impedance isolation between the locally grounded chopper and the reference grounded oscillator.

The heat sink may comprise a heat conducting metal plate, such as of aluminum or copper in combination with mica or thin plastic insulators, and/or it may comprise a single crystal of a metal oxide single crystal such as sapphire, quartz or diamond. When discrete MOSFETs are used, their hermetic containers are cemented in snug holes in these metal plates. Or, they are soldered to the faces of the single crystals, when encountered in non-encapsulated chip form. The terminals of the bridge are also heat sinks and may comprise copper threaded bolts and nuts extending through in thermally conducting but electrically insulated fashion from the plates, or they may be copper pots soldered to a sapphire, quartz or diamond heat sink. The whole assembly is then covered with a shield, such as of light aluminum, to prevent air currents from further causing thermal gradients within the terminals or MOSFETs mounted on the plate. Ultimate voltage stability is achieved by mounting the low-voltage source on a common heat sink or plate with the balanced bridge circuit as at a location remote to the transformers and remaining amplifier and processing circuitry.

The normally off MOSFETs are arranged in the bridge circuit so that they form the configuration of a square, in which each conducting leg of the square includes one MOSFET connected to its drain/source terminals or channel contacts. One pair of opposite corners of this square configuration comprise the input terminals to the balanced bridge circuit and the other opposite pair of corners comprise the output terminals of the balanced bridge circuit. The low-voltage source to be chopped or modulated by the bridge circuit is connected either directly to the input terminals or through a balanced twin-tee filter to the input terminals. The input filter is tuned to 60Hz. resonance in this case, but other common mode frequencies can likewise be resonated to attenuate not only the dominant common-mode signal, but also all higher frequency common-mode signals, thereby preventing such signals from causing serious saturation cutoffs, and nonlinear distortions of the desirable signal in early stages of the signal processing. Each of the input terminals is also connected, through a high-value resistor and/or biasing voltage, to the substrate terminals of the two adjacent MOSFETs.

The square wave source for driving the balanced bridge chopper is preferably generated by a conventional square wave generator connected to the isolator, both of which are located away from the chopper and low-voltage source. The drive transformer, when used, is preferably composed of a single primary coil connected to an osicillator or square wave generator, and two center tapped secondary coils, all three of which are wound on a common core. One of the two secondary coils has its ends connected to the gates of one pair of normally off MOSFETs adjacent one input terminal, while its center tap is connected to that input terminal. The ends of the other secondary coil are connected to the gates of the other two normally off MOSFETs adjacent to the other input terminal, with its center tap connected to that input terminal. Phasing of the connections between the two secondary windings and the MOSFET gates is so arranged that the pairs of MOSFETs opposite each other in the bridge circuit are simultaneously on while the other pair of opposed MOSFETs are simultaneously off. Since the driving transformer is remote from the chopper, the conductors between them should preferably comprise six wires arranged into three twisted pairs: one pair from the ends of one secondary winding for the gates of one pair of MOSFETs, another pair from the ends of the other secondary winding for the gates of the other pair of MOSFETs, and the third pair from the center taps to the two input terminals. All three twisted pairs are located within a common outer shield which is connected to the local ground.

Since it is practically impossible to obtain four discrete MOSFETs which are exactly equal in their internal capacitance and resistance, a pair of trimmer capacitors or condensers, usually in the low picofarad range, are connected between one bridge output terminal and the gates of the two MOSFETs connected to that output terminal for balancing out any gate-drive voltage which has been capacitively coupled to the low-level channel. Trimmer capacitors may also be connected between the output terminals from the bridge circuit and the local ground to further balance out any common-mode signal appearing at the output terminals from the bridge. The chopper of this invention may be manufactured as a planar integrated circuit with one or more balanced bridge circuits formed entirely within and on a single crystal of silicon. In mass production, such an integrated circuit can be standardized so that each of the four MOSFET gate arms are capacitively balanced, thereby eliminating the need for the gate connected trimmer capacitors.

The output from the remote chopper circuit of the invention, since it is an A.C. signal, may be transmitted by a triple coaxial cable to a distant point for amplification and/or demodulation, such as to a distantly located coupling transformer, A.C. amplifier, synchronous demodulator which is preferably driven and coupled through a transformer from the same oscillator that drives the balanced bridge circuit or chopper, so as to be in synchronism with the modulated signals to be detected, and thence from the demodulator through a D.C. amplifier. Significant advantage is herein gained by transmitting A.C. rather than D.C. low-level signals from the near presence of the remote source to the distant first stage of amplification. That is, the transmitted A.C. signal can no longer be deteriorated by near-D.C. thermally generated lead signals.

According to a further aspect of the invention, a plurality of the remote chopper circuits may be connected in a multiplexing circuit. In a controlled process or system, for example, a plurality of different voltage sources or transducers can monitor different conditions or parameters. Each separate source is connected to the input of a different balanced bridge chopper. The remote chopper outputs are connected to triple coaxial cables which lead to and are connected in parallel to the distant A.C. amplifier, demodulator and D.C. amplifier. The final D.C. output may be digitized and supplied to a programmable controller, such as a digital computer. The controller and address logic determine which one of the chopper circuits is driven by the square wave drive source at any given time. Switched remote preamplifiers may be provided for selectively connecting the outputs from the different choppers to the common first stage amplifier at the same time the chopper receives a drive signal. The switched preamplifiers are particularly useful for sub-microvolt applications and/or for systems where the sources require local common grounding.

Accordingly, it is an object of this invention to provide apparatus for accurately measuring from a common location low-level voltages from a collection of one or more remote sources.

Another object of this invention is to produce a simple, efficient, effective, economic, compact, shielded, reliable and substantially completely balanced chopper circuit for modulating low-voltage signals that is substantially unaffected by outside changes in temperature, air currents, and/or magnetic fields.

Another object of this invention is to produce such a chopper circuit which is mounted on a heat sink to prevent slow voltage drifts and other spurious thermally generated voltages from affecting low-level signals to be modulated, which eliminates substantially all conductive leakage of its transistors and which improves the voltage sensitivity of the circuit over prior known circuits by a factor of about one thousand.

Another object is to produce such a chopper circuit which has no moving parts, may be encapsulated and/or integrated, and which will operate accurately from room temperature to substantially absolute zero, and can be installed adjacent to the source it is to modulate and remote from its driving and detecting circuits.

Another object of this invention is to provide a chopper circuit suitable for locating adjacent a very low-level, remotely-located voltage source for modulating such source prior to conducting the modulated low-level voltage to a distant point.

Still another object of the invention is to provide apparatus for multiplexing a plurality of low-level signals from remote sources to a distant point.

Other objects and advantages of the invention will be apparent from the following detailed description, with reference being made to the accompanying drawings.

BRIEF DESCRIPTION OF THE DRAWINGS

FIG. I is a schematic block diagram of a low-voltage modulating and detecting circuit employing a balanced bridge chopping circuit in accordance with the features of this invention;

FIG. II discloses a schematic wiring diagram of the balanced bridge chopping circuit according to one embodiment of the invention, with its input circuits thereto, namely the low-voltage source to be modulated, and the driving square wave source and its coupling transformer;

FIG. III is a side elevation of one embodiment of apparatus incorporating a mechanical stud type heat sink for the chopping circuit shown in FIG. II, with part of the cover therefor being broken away;

FIG. IV is an end view of the apparatus shown in FIG. III, with part of its cover broken away;

FIG. V is a rear view of the apparatus shown in FIG. III;

FIG. VI is an enlarged sectional view of one of the heat sink terminals taken along line VI—VI in the central portionn of FIG. IV;

FIG. VII is an enlarged sectional view taken along line VII—VII of FIG. III showing the mounting of one of the transistors in the heat sink plate;

FIG. VIII is a side elevational view, similar to FIG. III, of another embodiment of apparatus according to this invention incorporating a chopping circuit in which the terminals are soldered to a metal oxide single crystal heat sink instead of being attached to studs;

FIG. IX is an end view of the apparatus shown in FIG. VIII showing the edge of the crystal upon which the terminals are mounted and the boss upon which the crystal is mounted;

FIG. X is a rear view of the apparatus shown in FIG. VIII;

FIG. XI is an enlarged schematic diagram of another embodiment of the chopper circuit, wherein four chip type MOSFETs and the four terminals of the circuit are all mounted on a metal oxide single crystal heat sink plate with its single crystal cover removed;

FIG. XII is a further enlarged sectional view taken along line XII—XII of FIG. XI showing the bonding layer over the metal conducting layer for and to the edge of the single crystal cover;

FIG. XIII is a schematic wiring diagram of a modified balanced bridge chopping circuit according to the present invention;

FIG. XIV is a greatly enlarged top plan view of a planar-silicon integrated circuit embodiment of the balanced MOSFET switching bridge of FIG. XIII with all of the MOSFET substrates in common;

FIG. XV is a cross-sectional view taken along line XV—XV of FIG. XIV and showing the channel region of one of the integrated circuit MOSFETs;

FIG. XVI is a schematic block diagram of one embodiment of a circuit for multiplexing the outputs of a plurality of chopping circuits in accordance with this invention;

FIG. XVII is a schematic block diagram of a modified circuit for multiplexing the outputs of a plurality of chopping circuits and suitable for extremely low-voltage operation;

FIG. XVIII is a schematic circuit diagram of a novel photovoltaic voltage generator, driving a normally-off MOSFET, and which also may be used to replace the isolation devices and D.C. source which drive the gate contacts and the D.C. source which back-biases the substrates of the bridge MOSFETs in the circuit of FIG. XIII;

FIG. XIX is a greatly enlarged fragmentary view of a portion of an integrated circuit embodiment of the photovaltaic voltage source; and FIG. XX is a cross-sectional view taken along line XX—XX of FIG. XIX.

DETAILED DESCRIPTION OF THE INVENTION

Referring first to FIG. I, a balanced bridge chopper 20 in accordance with one exemplary embodiment of the invention is shown mounted on a heat sink 27 which is in common with the shield of a remotely-located, low-level voltage source 24 which is to be modulated by the chopper 20. The remotely modulated low-level voltage is easily conducted to a distant point through a coaxial cable 26 where it is coupled through a transformer 29 to an A.C. amplifier 28. The output from the amplifier 28 is applied through a synchronous demodulator 30 to a D.C. amplifier 39 for producing a final output.

A square wave drive source for modulating the low-voltage source in the chopper 20 comprises a remote oscillator 32 which is coupled by means of an isolation transformer 34 through three twisted wire pairs 35, 36 and 37 to the balanced bridge chopper 20. Or, the transformer 34 may be replaced with other types of isolators, such as the photoconductive isolators used in the circuit of FIG. XIII, but attached electrically in a different manner, or the novel photovoltaic isolation device shown in FIGS. XVI–XVIII. The drive oscillator 32, which is located remote from the low-level voltage source 24 and chopper 20, is also coupled through a transformer 38 to the demodulator 30, so that the demodulator 30 will be synchronized with the signal modulated in the chopper 20. The resulting demodulated signal then may be passed through the D.C. amplifier 39 before being applied to a final output. The final output may be used to drive a meter or for any other desired purpose. Of course, it will be appreciated that the signal processing techniques involving the A.C. amplifier 28, the synchronous demodulator 30 and the D.C. amplifier 39 are only exemplary. The chopped low-level signal may be transmitted to any suitable circuit. Furthermore, the linear circuit may have a manually incremented gain or an automatically incremented gain, referred to as an autoranging response.

It will be noted that FIG. I shows two separate grounds 33 and 33'. Shielding for the twisted wire pairs 35, 36 and 37, shielding for the coaxial cable 26 and shielding for the chopper 20 are connected to the remote local ground 33' at the low-level voltage source 24. The drive oscillator 32, the transformer 38, the A.C. amplifier 28, the demodulator 30 and the D.C. amplifier 39 are all either connected to or located adjacent the reference ground 33 at the distant location of such apparatus. The two ground levels are isolated at the transformer 29 and the transformer or other suitable isolator 34 to minimize common mode signals. Although the two ground connections are usually continuous, their remote location will often produce a steady-state emf between them which may be as large as one volt and considerably higher during transient peaks.

Referring now to FIG. II, the source 24 is shown to be schematically located in a shielded box 25 which is electrically connected to the local ground 33' along with the heat sink 27 and a shield 31 around the twisted wire pairs 35, 36 and 37 for isolation. The source 24 is shown as a Thevinen's equivalent circuit of a voltage source $E_s$ in series with an internal resistance $R_s$ and is connected through terminals 72 and 73 to the chopper 20 by conductors 23 which are as short as possible.

The specific balanced bridge chopper 20 shown in FIG. II has a square configuration with four legs. Four metal oxide semiconductor field effect transistors (MOSFETs) 41, 42, 43 and 44, respectively, form the legs of the bridge with the source/drain terminals connected to form the junctions or corners of the bridge. The corners of this square configuration are connected to terminals 45, 46, 47 and 48. Two opposed terminals 45 and 47 are the two input terminals which are connected directly through conductors 21 and 22, respectively, to the terminals 72 and 73 connected to the low-voltage source 24. The terminals 46 and 48 at the remaining opposed corners of the square configuration are A.C. output terminals.

The square-wave driving voltage applied to the chopper 20 for modulating the low-voltage source signal is applied via conductors 51 and 52 from the ends of a first secondary winding 53 of the drive transformer 34, respectively, and the twisted wire pair 35 to the gates of the transistors or MOSFETs 41 and 42 adjacent one of the input terminals 45, and via conductors 55 and 56 from the ends of a second secondary winding 54 of the drive transformer 34, respectively, through the twisted-wire pair 37 to the gates of the other two transistors or MOSFETs 43 and 44 adjacent to the other input terminal 47. The secondary windings 53 and 54 are provided, respectively, with center taps 58 and 59. In order to synchronize the chopper 20, the transformer 34 has both of its secondary windings 53 and 54 wound on a common core 57 with a single primary winding 40. The secondary windings 53 and 54 are surrounded by a shield which is connected to the local ground 33' by the cable shield 31. In addition, center taps 58 and 59 of the two secondary windings 53 and 54 are connected via the twisted wire pair 36 to the two input terminals 45 and 47, respectively. Each input terminal 45 and 47 is also connected to the substrates of the two adjacent transistors or MOSFETs, namely MOSFETs 41 and 42 from terminal 45 and MOSFETs 43 and 44 from terminal 47. For very low-voltage measurements, direct connections may be made between each input terminal and the substrates of the two adjoining MOSFETs, although this is of no particular advantage. If voltage measurements are to include a range of values larger than about one millivolt, it is preferable for greater circuit flexibility to connect the input terminal 45 through a high-valued resistor 49 (typically 10 megohms) to the substrates of the adjoining MOSFETs 41 and 42 and to connect the input terminal 47 through a similar high-valued resistor 50 to the substrates of the adjoining MOSFETs 43 and 44. In a modification to the circuit shown in FIG. II, the substrate resistors 49 and 50 can be replaced with D.C. voltage sources (not shown) of about two to five volts and arranged to back-bias the MOSFET substrates with respect to the adjacent input terminals 45 and 47, respectively. This use of a D.C. voltage source becomes especially convenient when photoconducting isolators are used in place of the gate-drive transformer 34, as is discussed in greater detail below.

Since it is substantially impossible to get four MOSFETs which have exactly the same internal capacitances, it is necessary that they be trimmed or balanced. Capacitive balancing is accomplished by means of a pair of variable trimmer capacitors or condensers 60 and 62. Each of these capacitors has one of its terminals connected in common to one of the outputs of the chopping bridge circuit 20, herein output 46, and has its other terminal connected to the gate of one of two MOSFETs adjacent that output terminal, namely the other terminal of capacitor 60 to the gate of MOSFET 42 and the other terminal of the capacitor 62 to the gate of the MOSFET 43.

The coupling of the square-wave driving voltage to the chopper 20, alternately and simultaneously, causes the opposite pair of MOSFETs 41 and 43 and then the opposite pair of MOSFETs 42 and 44 to be conductive and nonconductive to modulate the low-voltage from the source 24 equally to positive and negative portions of the square wave taken from the output terminals 46 and 48. In other words, the A.C. signal appearing at the output terminals 46 and 48 is a square wave which is symmetrical around the voltage at the local ground 33' and has a peak-to-peak amplitude of $2E_s$. The A.C. modulated signal at the output terminals 46 and 48 from the chopper 20 may be easily conducted through the coaxial cable 26 to a distant location for amplification, demodulation and detection.

The coaxial cable 26 is of a triple coaxial cable type having an inner or center conductor 64 connected to one of the chopper input terminals, herein terminal 48, and an outer conductor 65 connected to the other chopper output terminal 46. Shielding 66 surrounding the outer conductor 65 is connected to the local ground 33' at the low-level voltage source 24. The shielding 66 eliminates electrostatic effects on the cable 26 while the symmetry of the triple coaxial cable 26 eliminates magnetically induced signals along the high impedance path.

The distant end of the coaxial cable 26 is shown connected to a primary winding 68 of the transformer 29 while a secondary winding 69 is connected to the A.C. amplifier 28. The primary winding 68 is also shielded and connected through the cable shielding 66 to the local ground 33'.

One specific exemplary structural embodiment for the balanced bridge chopper 20 is shown in FIGS. III through VII, which comprises an inverted T-shaped heat sink metal plate and support 70 of aluminum or copper, which may be mounted by means of screws 71 to the support and shield of the low-voltage source 24, thereby also providing them with a common heat sink as is shown in FIG. I. This plate 70 may be provided with several apertures for heat sink type terminals of the type shown in detail in FIG. VI, and also with blind holes for heat sink mounting the cans or covers of the MOSFETs 41, 42, 43 and 44, as shown in FIG. VII.

One of the terminals, namely output terminal 46, is shown enlarged and in section in FIG. VI. The terminal 46 is similar in construction to each of the other terminals 45, 47 and 48, as well as the additional external input terminals 72 and 73 used for making electrical connection to the conductors 23 from the low-voltage source 24. Each of these terminals comprises centrally, a copper threaded screw, stud or threaded rod 75 which extends through an aperture 76 in the plate 70. The aperture 76 is larger in diameter than the outside diameter of the screw 75 in order to include an electrically insulating sleeve 77. At each end of the aperture 76 and concentric therewith is provided an electrically insulated washer 78, such as a silicon-greased mica washer, so as to electrically insulate the screw 75 and copper end nuts 80 and 82 threaded on the screw 75 from the plate 70. Between the nut 82 and the insulating washer 78, there is provided a carefully deburred copper washer 83, and between the nut 80 and the other washer 78 there is provided a pair of carefully deburred copper washers 84. Between the pair of washers 84, an apertured conductor terminal 85 is clamped. The terminal 85 is mounted on the end of one or more of the conductors connected to the bridge terminal 46. The relative mass of the screw 75 and the nuts 80 and 82 connecting the screw 75 to the plate 70 for each of the terminals 45–48, 72 and 73, effectively acts as a heat sink to reduce any spurious thermoelectric voltages at these terminals.

If desired, insulated terminals blocks 90 and 92 may be provided for making terminal connections to the ends of the output cable 26 and the ends of the twisted wire pairs 35, 36 and 37 in the shielded cable 31 from the drive transformer 34 before being connected to the heat sinked terminals 45, 46, 47 and 48 in accordance with the circuit shown in FIG. II. The locally grounded shields 66 and 31 are shown extending around each of the cable 26 and the three twisted wire pairs 35, 36 and 37, respectively, in FIGS. II and III, which cable and wires extend through apertures in the plate 70 as shown in FIGS. III and V. The shields 66 and 31 are grounded to the plate 70.

The trimmer capacitors 60 and 62 for the MOSFETs are also mounted on and through the plate 70 and may have slotted screwdriver adjustments 61 and 63, respectively, projecting through the back of the plate 70 as shown in FIG. V. The purpose of this arrangement is to permit final balancing out of the coupled gate-drive signal from the low-level circuit while the shield cover is in place.

The MOSFETs 41, 42, 43 and 44 are preferably coated with an insulating layer 93, such as varnished paper or a light gauge nylon mesh, and are mounted in snugly fitted blind holes 95 as MOSFET 43 is shown in FIG. VII. A diametrical slot 97 extends across the hole 95. When the MOSFETs are installed, they are first dipped in a fresh adhesive hardening resin such as varnish for anchoring them in place in their holes 95. If the MOSFETs are to be removed, a solvent is introduced into the slot 97 to dissolve the resin.

The assembly of parts on the plate 70 as shown in FIG. III, comprising the MOSFETs 41, 42, 43 and 44, the terminals 45, 46, 47 and 48, the capacitors 60 and 62 and the terminal blocks 90 and 92, is preferably enclosed by a cover 100, such as a box of light aluminum. The cover 100 is shown as having tabs 99 on its corners for anchoring it to the plate 70. Similarly, the other side of the terminals 45, 46, 47 and 48 should be enclosed by a cover 101, as shown in FIGS. IV and V. The covers 100 and 101 serve multiple functions as heat sinks, as electrostatic shields, as dust hoods to help maintain the necessary high electrical leakage resistance required at the heat sinked connections and, by the mounting screws 71, as remote local ground points. The covers 100 and 101 facilitate using the chopper 20 in industrial or other hostile environments wherein temperature extremes, temperature gradients and electrical and magnetic noise may exist.

Referring now to FIGS. VIII, IX and X, there is shown apparatus similar to that shown in FIGS. III, IV and V, in which similar parts have been given the same reference characters. Instead of employing the bolts and nuts for the heat sinked terminals 45, 46, 47 and 48, in this embodiment, terminals 45', 46', 47' and 48' have been fabricated by using terminals 111 mounted on an electrically insulating and heat conducting metal oxide single crystal 110 which is in turn mounted on a raised boss portion 105 (shown in FIG. IX) of the copper heat sink plate 70. The metal oxide single crystal 110, such as sapphire, is soldered by pure indium solder 106 to the boss 105 and the separate button or pot copper terminals 111 are similarly soldered to its other side. However, the solder used within the terminals 111 for making electrical circuit connections is composed preferably of 44% atomic indium, 42% atomic tin and 14% atomic cadmium, or of a suitable substitute which melts well below the melting temperature of pure indium. This permits soldering the leads to and from the chopper bridge circuit 20 to the terminals 111 without the terminals 111 separating from the crystal 110. This construction using the heat sinked crystal 110 eliminates the necessity of apertures in the plate 70 for the four terminals 45', 46', 47' and 48', as well as the need for a rear cover 101 (see FIGS. IX and X).

Referring now to FIG. XI, a physically compact hybrid circuit embodiment of the chopper 20 is shown in which each of the transistors or MOSFETs 41, 42, 43 and 44 in a non-encapsulated chip form are mounted on a printed circuit having radially outwardly extending metal conducting layers 114–121 which comprise the lead contacts to and from these transistors or MOSFETs. The printed circuit is formed on a thermally conducting but electrically insulating single crystal plate 113, such as sapphire, of about one or two centimeters square which also acts as the heat sink. Printed on the plate 113 are all of the terminals 114–121 for the balanced bridge chopper 20 of FIG. II. The two MOSFETs 41 and 42 having interconnected substrates are mounted on a common electrically conducting substrate pad 122 printed on the plate 113 and the other two MOSFETs 43 and 44 having interconnected substrates are mounted on a common electrically conducting substrate pad 123 printed on the plate 113. Wires from the substrates of each of the MOSFETs 41–44 are further soldered or bonded to the adjacent pad 122 or 123. The conducting layer 114 forms the input terminal 45 and is connected directly to source/drain contacts of the MOSFETs 41 and 42 and also through the high-valued substrate resistor 49 to the pad 122. Similarly, the conducting layer 116 forms the other input terminal 47 and is connected directly to source/drain contacts of the MOSFETs 43 and 44 and also through the high-valued substrate resistor 50 to the pad 123. The conducting layer 115 forms the output terminal 46 and is connected directly to the source/drain contacts of the MOSFETs 42 and 43, and the conducting layer 117 forms the other output terminal 48 and is connected directly to the source/drain contacts of the MOSFETs 41 and 44. Gate contacts of the MOSFETs 41–44 are connected, respectively, to the conducting layers 118–121. Connections between the conducting layers 114–121 and the MOSFETs 41–44 are made by bonded wires.

The outwardly extending radial portions of each of the printed conducting layers 114–121 all pass under an annular band 124 of glass frit, or other suitable bonding agent, which is fused to the top surface of the plate 113. A metal oxide single crystal cover 125 (see FIG. XII) of substantially the same composition as the plate 113 is fused to the band 124 to hermetically seal and encapsulate the bridge circuit 20. Prior to encapsulation, the cover 125 has its band contacting edge also impregnated with a fused glass frit layer 126, or other suitable bonding agent, so that the two glass frit layers or bonding agents 124 and 126 can be readily fused together to make the seal. The centers of each of the circular outer ends of the printed conducting layers 114–121 are shown to have holes drilled through them and through the adjoining plate 113 for making electrical connections to the conducting layers 114–121 in a conventional manner.

Turning now to FIG. XIII, a modified circuit is shown for the balanced bridge chopper 20' which is particularly suitable for rejection of undesirable common-mode signals in the measurement of remote voltages as low as a few nanovolts in extremely adverse noise environments. The chopper 20' is provided with a balanced twin-tee input filter 130 for assisting in the elimination of common-mode signals, being most effective at the resonant filter frequency, which is usually but not necessarily adjusted to 60 Hz. Optical isolation between the local ground 33' and the reference ground 33 is provided for the square wave chopper drive, functionally taking the place of the isolation transformer 34 shown in the circuit of FIG. II. However, it is to be recognized that whereas photoconductive isolators and transformers may be interchanged in the gate drivers of the two circuits of FIGS. II and XIII, the details of the two circuits are distinctly unique. Finally, the chopper 20' includes a preamplifier 131 for the A.C. output. The preamplifier 131 improves the common-mode rejection capability of the system. The preamplifier 131 also reduces the effects of distributed capacitance along the transmission line connecting the chopper 20' to the remote receiver and the effects of capacitive loading when the outputs from several choppers 20' are multiplexed on a single transmission line connected to a single receiver, as will be discussed in greater detail below in reference to FIGS. XVI and XVII.

The external input terminals 72 and 73, which are connected to the low-level voltage source, are connected through the input filter 130 to the input terminals 45 and 47 of the balanced bridge chopper 20'. The balanced twin-tee input filter 130 is of a novel symmetrical RC design. The terminal 72 is connected through a parallel capacitor 132 and resistor 133 to the bridge terminal 45 and through a series variable resistor 134 and capacitor 135 to the bridge terminal 47. Similarly, the terminal 73 is connected through a parallel capacitor 136 and resistor 137 to the bridge terminal 47 and through a series variable resistor 138 and capacitor 139 to the bridge terminal 45. In addition, two zener diodes 128 and 129 are connected in series and back-to-back between the terminals 45 and 47 to function with the resistors 133 and 137 in protecting the MOSFETs 41, 42, 43 and 44 of the chopper 20 from destructive voltage surges or from an accidental application of a high-voltage to the terminals 72 and 73.

The actual component values and quality of the resistors and capacitors in the input filter 130 must be carefully selected when extremely low voltages such as a few nanovolts are to be modulated, or the filter 130 will become a significant noise source. In very low-level applications, resistor elements become a source of Johnson noise. Since the equivalent Johnson noise voltage from a resistor element is proportional to the square root of the resistance, it is desirable to keep the resistors 133 and 137 as small as possible. Also, being in the very low-voltage input section of the chopper 20', only high-quality non-polar linear capacitors, such as Mylar capacitors, are acceptable for the capacitors 132, 135, 136 and 139. Because of their cost and physical size limitations, the capacitors 132, 135, 136 and 139 cannot be much larger than 5 to 10 mfd. One exemplary set of component values for the input filter 130 has been found to be 1060 ohms for the resistors 133 and 137 and 2.5 mfd. for the capacitors 132 and 136. The capacitors 135 and 139 will then be 5 mfd. and the variable resistors 134 and 138 are set to 530 ohms. Such a filter attains its high attenuation at the 60 Hz. resonant frequency.

In addition to Johnson noise, the resistors 133 and 137 can also become a thermoelectric generator or a 1/F "flicker noise" source of low-frequency noise. This noise can be significantly minimized by winding the resistors 133 and 137 from Manganin wire, which has the same thermoelectric power coefficient as copper, and by winding the resistors onto and encasing them within a thermally conducting insulating compound. The windings are made in a bifilar manner to virtually eliminate inductance and magnetic flux pickup. Finally, the terminals to the resistors 133 and 137 should be connected to the common heat sink for the chopper 20' and the input terminals 72 and 73 to minimize this low-frequency noise effect.

The circuit of FIG. XIII uses an identical balanced bridge switch as in the circuit of FIG. II, with the source/drain contacts of the four MOSFETs 41, 42, 43 and 44 connected between the terminals 45, 46, 47 and 48 to form the square configuration of the chopper 20'. However, substrate connections to the MOSFETs are modified to provide back-biasing. Two equal high-valued resistors 140 and 141 are connected in series between the input terminals 45 and 47. An isolated D.C. voltage source 142 of 5 volts, for example, is connected from the junction between the series resistors 140 and 141 to the common substrate connections on the MOSFETs 41, 42, 43 and 44 to back-bias the substrates. The back-biasing prevents the MOSFETs from leaking at high input voltage $E_s$ levels.

The square wave drive for the chopper 20' is generated by an oscillator 178 driving a Schmitt trigger 179 which in turn drives a triggered flip-flop 144 and then two AND gates 145 and 146. An enable signal is applied on an "address control" input 147 from a suitable external control (not shown) when the chopper 20' is to be operated. The address control input 147 is provided for disabling the chopper 20' when several choppers are multiplexed together. When this feature is not needed, the gates 145 and 146 may be replaced with amplifiers. This arrangement causes the flip-flop 144 to develop alternately high Q and $\overline{Q}$ outputs at a desired chopping frequency, such as a fixed frequency within a range from about 10 Hz. to about 10,000 Hz. The Q and $\overline{Q}$ outputs from the flip-flop 144 are connected, respectively, to the AND gates 145 and 146 such that the gates 145 and 146 produce alternate outputs when enabled by a signal on the input 147.

The alternate outputs from the gates 145 and 146 drive the balanced bridge chopper. However, isolation is necessary since the oscillator 178, the Schmitt trigger 179, the flip-flop 144 and the gates 145 and 146 are connected to the reference ground 33 while the chopper 20' is connected to the local ground 33'. Isolation is accomplished by two optical isolation devices 148 and 149. The isolation device 148 includes a light emitting diode (LED) 150 and an optically driven photodiode or phototransistor 151, while the device 149 includes an LED 152 and an optically driven photodiode or phototransistor 153. The output from the gate 145 is connected to excite the LED 150 which optically drives the photodevice 151. Similarly, the output from the gate 146 is connected to excite the LED 152 which optically drives the photodevice 153.

The common connection between the series high-valued resistors 140 and 141 across the input terminals 45 and 47 is used as a drive point for symmetrically driving the chopper 20' in addition to its use for symmetrically back-biasing the MOSFET substrates. The connection between the resistors 140 and 141 is connected through a D.C. voltage source 154 to the photodevices 151 and 153 in the isolation devices 148 and 149, respectively. The other electrode of the photodevice 151 is connected to the gate electrodes of the MOSFETs 41 and 43 and the other electrode of the photodevice 153 is connected to the gate electrodes of the MOSFETs 42 and 44 so that the normally off MOSFETs 41 and 43 conduct when the LED 150 is excited and the normally off MOSFETs 42 and 44 conduct when LED 152 is excited. A resistor 155 is shown connected across the D.C. source 154 and the photodevice 151 and a resistor 156 is shown connected across the D.C. source 154 and the photodevice 153. The resistors 155 and 156 provide controlled leakage paths for fast gate "turn off" of the MOSFETs.

The A.C. output from the remote chopper 20' is passed through the preamplifier 131 prior to transmitting over a coaxial cable 157 to the distant amplifier, demodulator and other common signal processing apparatus which form a receiver. The preamplifier 131 is of a push-pull type and includes two very low noise junction field effect transistors (JFETs) 158 and 159. The bridge output terminal 46 is connected through a coupling capacitor 160 to the gate of the JFET 158 and the bridge output terminal 48 is connected through a coupling capacitor 161 to the gate of the JFET 159. The gates of the JFETs 158 and 159 are also connected to the local ground 33' through high-valued resistors 162 and 163 which may be on the order of 10 to 100 megohms.

The coaxial cable 157 includes three conductors 164, 165, and 166 and an outer shield 167. The conductor 164 and the shield 167 are connected to the local ground 33' at the remote chopper 20'. At the distant receiver, the conductor 164 is connected through a low-valued resistor 168 to the reference ground 33. At the receiver end of the cable 157, the conductors 165 and 166 are connected, respectively, to drain contacts of a pair of switching MOSFETs 180 and 181. The source contacts of the switching MOSFETs 180 and 181 are connected, respectively, through resistors 170 and 171 and a D.C. bias voltage source to the reference ground 33 and to output terminals 172 and 173 which may be connected to a common differential amplifier and demodulator (not shown). The voltage source 169 biases the preamplifier 131 while the resistor 168 prevents a circulating ground loop from developing within the cable 157 and also serves to improve the common-mode rejection capability of the overall circuitry. The source contacts on each of the JFETs 158 and 159 are connected to the local ground 33' while the drain contacts are connected, respectively, to the cable conductors 165 and 166. Thus, the modulated low-level signal alternately appears at the chopper outputs 46 and 48 for alternately driving the preamplifier transistors 158 and 159. Gate contacts on the switching MOSFETs 180 and 181 are connected to the address control input 147 so that the MOSFETs 180 and 181 are switched on whenever the AND gates 145 and 146 are enabled. Thus, the low-level voltage is chopped and amplified and this A.C. signal is conducted over the cable 157 and applied through the switching MOSFETs 180 and 181 to the output terminals 172 and 173 when an enable signal is applied to the address control input 147.

Input connections 182 and 183 are shown to the substrates of the switching MOSFETs 180 and 181, respectively. These connections may be used for applying negative feedback from the output of an A.C. amplifier connected to the terminals 172 and 173 for total amplifier gain stabilization. Separate adjustments on the level of the negative phased feedback signals to the connections 182 and 183 may be used to compensate for any mismatch in the preamplifier JFETs 158 and 159 as well as any mismatch in the switching MOSFETs 180 and 181. Overall feedback stabilization also permits wider environmental temperature extremes in which the entire chopper assembly can be operated because it will compensate for gain-temperature variations.

Four trimmer capacitors 174–177 are provided for further balancing the chopper 20'. The capacitors 174 and 175 are connected, respectively, between the bridge output terminals 46 and 48 and the local ground 33'. These capacitors 174 and 175 are used to achieve an impedance balance at the dominant common-mode signal frequency, usually 60 Hz., thus permitting use of very high values for the output resistors 162 and 163. The capacitor 176 is connected from one of the output terminals, terminal 146 shown in FIG. XIII, to the common gates of the MOSFETs 41 and 43 and the capacitor 177 is connected from the same output terminal 46 to the common gates of the MOSFETs 42 and 44. By carefully adjusting the capacitors 176 and 177, gate-channel capacitance unbalance can be reduced, typically by a factor of from 0.1 to 0.01 of its untrimmed level, thus keeping the low-level channel relatively free from gate-drive signals, which would otherwise contribute to zero voltage offset problems, and could lead to measurement resolution limitations at very low signal levels.

By locating the preamplifier 131 with the chopper 20', the chopper 20' effectively sees only the heat sink capacitance to local ground 33' in the high impedance circuit which may, for example, be on the order of about 20 pfd. Without the preamplifier 131, as in the circuit of FIG. II, the output from the chopper 20' is also loaded down by the distributed capacitance from the coaxial cable connecting the output from the chopper 20' to the remote location all at high impedance. For a 10 foot cable, this capacitance typically may be about 200 pfd. This decrease in effective output capacitance at the high impedance chopper output terminals 46 and 48 by a factor of 10 permits a similar increase by a factor of 10 of the value of the resistors 162 and 163. Also, the use of the preamplifier 131 at the location of the remote chopper 20', where it is at local ground 33' instead of at reference ground 33, serves to keep the induced type commonmode noise signals two to three orders of magnitude smaller whenever one of the low-level input source terminals 72 or 73 must be at the local ground potential.

Referring now to FIGS. XIV and XV, there is shown one possible construction of a completely integrated circuit for the balanced bridge chopper 20' of this invention. Herein the conducting substrate 184 may comprise p-type silicon for all four of the MOSFETs or transistors 41, 42, 43 and 44, upon which substrate is deposited the four equally spaced source/drain metalized sector-shaped layers 185a, 185b, 185c and 185d in a circle to which are connected, respectively and alternately, conductors for the input and output terminals 45, 46, 47 and 48. The boundaries of the oxide windows under each of these sector layers or plates 185a, 185b, 185c and 185d are indicated by the solid lines 186, and that for the n+ ohmic contact diffusion boundaries of the closed regions are indicated by the dotted lines 186' around these layers or plates and around the boundaries 186. The spaces between adjacent boundaries 186' of adjacent sector plates 185a, 185b, 185c and 185d are bridged by oxide layers 187 as shown in FIG. XV. On the tops of these bridging oxide layers 187 are deposited the gate electrode metalization or layers 188a, 188b, 188c and 188d to which the gate connections of each of the MOSFETs are made. In the manufacture of these particular connections 188a through 188d, they may be formed to extend various radial distances in between the gaps between adjacent sectors 185a through 185d by production mask modifications, depending upon the capacity between these sectors, so that a substantially balanced bridge chopper circuit can be manufactured in mass production without the requirement of trimmer condensers 60 and 62 in the circuit of FIG. II or of trimmer condensers 176 and 177 in the circuit of FIG. XIII, as described above.

It has previously been stated that the chopper 20' shown in the circuit of FIG. XIII will receive a drive signal only while a signal is applied to the address control input 147 to enable the AND gates 145 and 146. While the gates 145 and 146 are disabled, all of the four MOSFETs 41, 42, 43 and 44 of the chopper 20' will remain off. With all of the MOSFETs off, the chopper output will be blocked and the output terminals 46 and 48 will have a very high impedance, similar to an open switch. This ability to use the balanced bridge chopper 20' as a local ground level signal blocking switch under the control of reference grounded logic level addressing circuitry permits the use of the copper 20' in an N data channel low-level multiplexer. Such a multiplexing system is readily adaptable to continuous on-line control of a complex system or industrial process, in addition to being useful as an N-channel data collecting system.

Turning now to FIG. XVI, an N data channel multiplexing system 190 is shown for controlling an industrial process or system 191. The system 191 includes N data sensors (not shown) for monitoring N different parameters or conditions within the system 191. The different sensors may be of any conventional design, floating or otherwise not electrically connected to the local ground, and they may vary in detail within the system 191, depending upon the actual parameter or condition they are required to measure. The sensors generate output voltages $E_{S1}$, $E_{S2}$ . . . $E_{SN}$ which are typically on the order of one microvolt or larger up to possibly several volts, with time variations possessing a range of from near-D.C. to low audio frequency response. A digital computer 192 or other suitable type of process controller is provided for controlling or monitoring the system 191 through signals applied over N control lines 193, when applicable, in response to the sensed voltages $E_{S1}$ through $E_{SN}$.

N balanced bridge choppers 194-1 through 194-N (only three shown) are provided for selectively modulating the N voltages $E_{S1}$ through $E_{SN}$ from the system sensors and for multiplexing the modulated voltages to the computer 192. The choppers 194 may be similar to the choppers 20' shown in FIG. XIII up to the points A–B which include the output coupling capacitors 160 and 161, with the preamplifier 131 omitted since neither sub-microvolt voltages nor locally grounded voltage sources are being measured in the exemplary multiplexing system of FIG. XVI. The twin-tee input 130 may also be eliminated in cases where 60 Hz. or some other dominant frequency common-mode noise signals are not a serious problem in a specific multiplexing system. The outputs from the choppers 194-1 through 194-N are connected through N locally grounded shielded coaxial cables 195-1 through 195-N in common to the input of an A.C. amplifier 196 at the distant location. The output from the amplifier 196 is connected through a synchronous demodulator 197, a low pass filter 198, a D.C. amplifier 199 and an autoranging analog-to-digital converter 200, which utilizes a digitally switchable incremental intermediate stage gain control feedback loop to the A.C. amplifier 196, to achieve an input to the computer 192. Depending upon which one of the choppers 194-1 through 194-N is operating at any given instant, a digitized representation of one of the sensor voltages $E_{S1}$ through $E_{SN}$ will be applied to the computer 192 where it may be stored in a memory 201 for use in either controlling the system 191 or for maintaining a time data record of the actual operation of the system 191.

Logic circuitry under the control of the computer 192 controls operation of the choppers 194-1 through 194-N. A reference oscillator 202, a Schmitt trigger 203 and a triggered flip-flop 204 continuously generate outputs which appear alternately on lines 205 and 206. The line 205 is connected to N AND gates, of which three typical gates 207–209 are shown. Similarly, the line 206 is connected to N AND gates, three of which gates 210–212 are shown. The lines 205 and 206 are also connected to the common demodulator 197 for synchronizing demodulation with the A.C. signal equivalent of whichever sensor chopper output is activated. The computer 192 supplies address data to an address control circuit 213 for selectively enabling the AND gates 207–212. The address control circuit 213 may, for example, consist of a binary-to-N line decoder. Depending upon binary address data received from the computer 192, the circuit 213 will apply a signal on one of N outputs, of which three outputs 214, 215 and 216 are shown. When a signal appears on the output 214 from the address control circuit 213, the gates 207 and 210 are enabled to apply square wave chopper drive signals from the flip-flop outputs 205 and 206 to the chopper 194-1. Similarly, the address control output 215 enables the gates 208 and 211 to apply square-wave drive signals to the chopper 194-2 and the address control output 216 enables the gates 209 and 212 to apply drive signals to the chopper 194-N. Since the address control circuit 213 applies a signal at most on only one of the N outputs, only one of the N choppers 194-1 through 194-N will be gated on at any given instant. Either by blocking an address output from the computer 192 or by addressing an unused output from the address control 213, all of the choppers 194-1 through 194-N will remain off. Thus, the computer 192 may be used on a time sharing basis and the digitized chopper output is disabled while the computer 192 performs functions other than the control or monitoring of the system 191. THe fact that only one channel at a time is permitted to transmit at the synchronous chopper frequency means that "cross-talk" between the N data channels is virtually totally eliminated. Furthermore, the high common-mode signal rejection ratio of each separate chopper assembly aids considerably in reducing complex ground loops which would otherwise arise if N separate local ground connections had to be made to the different transducers within the system 191.

An N data channel multiplexer 190' is shown in FIG. XVII with the addition of remote preamplifiers for each data channel and of individual channel isolation switching which is physically located adjacent the common A.C. amplifier 196. Each of the N data channels is identical to the circuit of FIG. XIII. However, circuitry to the left of points A–B is shown merely as the block representations of the choppers 194-1 through 194-N while the preamplifiers 131 and channel switching MOSFETs are shown in detail. The N separate data channels are connected via separate coaxial cables, of which three cables 217–219 are shown for three typical channels, to the A.C. amplifier 196. Isolation MOSFET switches are provided for each channel to prevent the (N-1) inactive preamplifiers from loading the activated preamplifier, as well as to prevent undesirable distributed cable capacitive loading at the input to the common amplifier 196. The source and drain contacts of a pair of switching MOSFETs 220 are connected in series between the two signal carrying conductors from the first channel coaxial cable 217 and the input of the A.C. amplifier 196. The gates of the MOSFETs 220 are connected in parallel to the output 214 from the address control circuit 213 such that the MOSFETs 220 are switched on whenever gate drive is applied through the AND gates 207 and 210 to the first channel chopper 194-1. Similarly, a pair of MOSFETs 221 are connected in series between the cables 218 and the A.C. amplifier 196 and have gate contacts connected to the output 215 from the address control circuit 213 and a pair of MOSFETs 222 are connected in series between the cable 219 and the A.C. amplifier 196 and have gate contacts connected to the address control output 216.

As indicated above, a separate preamplifier for each channel is located adjacent the choppers 194-1 through 194-N. Each preamplifier includes a pair of junction field effect transistors (JFETs) 223 and a pair of equal high-valued resistors 224. The gate contacts of the two JFETs 223 for a channel are connected, respectively, to the two output terminals from a chopper and through the resistors 224 in a balanced manner to the local ground, as in FIG. XIII. The source contact of ech JFET 223 is also connected to the local ground while the drain control is connected through a coaxial cable, cable 217 for the first channel, to the drain contact of one switching MOSFET, 220 for the first data channel, for applying a preamplifier signal to the input of the amplifier 196 when such data channel is activated. Biasing for the preamplifier is provided by means of a D.C. voltage source 225. Adjacent the amplifier 196, the positive terminal of the voltage source 224 is connected through two equal resistors 226 to the two input terminals to the amplifier 196. The negative terminal from the voltage source 225 is connected to the reference ground and also through a resistor 227, one for each data channel, and the coaxial cable to local ground for each data channel. The continuity between the reference ground and each local ground, necessary for individual preamplifier performance, is maintained with the low-valued resistors 227, which also serve to minimize circulating ground loops within the shielded cable for each channel. Through this arrangement of using preamplifiers and separate isolation switches for each channel, nearly complete isolation is provided, even though a common-mode signal may exist between the local ground for the different channels. Furthermore, as indicated above, the connection of the several channels in multiplexing arrangement to the common input of the A.C. amplifier 196 does not capacitively load the input to the amplifier 196 to an undesirable degree. Otherwise, excessive capacitive loading could have an adverse affect on common-mode rejection balance and possibly cause response time limitations on the overall signal processing.

As indicated above in the description of FIG. XIII, negative feedback is provided to the substrates of the switching MOSFETs 220 for stabilization. The feedback signals may be taken from the output terminals 253 and 254 from the A.C. amplifier 196. The output terminals 253 and 254 are connected to the reference ground through a pair of potentiometers for each channel. Potentiometer 255 is shown connected to the terminal 253 and potentiometer 256 is shown connected to the terminal 254 for providing adjustable feedback signals to the substrates of the switching MOSFETs 220 for the first channel. The connections from the A.C. amplifier output terminals 253 and 254 to the switching MOSFETs 220 are such that the feedback signals are negatively phased. By adjusting the potentiometers 255 and 256, the overall gain of each side of the channel is balanced for any mismatching of the preamplifier JFETs 223 and the switching MOSFETs 220 and the preamplifier is temperature stabilized.

The exemplary balanced bridge chopper circuit shown in FIG. XIII includes a D.C. voltage source 154 and two optical isolation devices 148 and 149 for driving the gates of the MOSFETs 41, 42, 43 and 44 and also includes a D.C. voltage source 142 for back-biasing the substrates of the MOSFETs 41, 42, 43 and 44. These elements may be replaced with a novel photovoltaic isolation device in accordance with another feature of the invention.

Turning to FIG. XVIII, a schematic circuit diagram is shown for a novel photvoltaic isolation device 235. When a D.C. voltage is applied, plus-to-negatively, respectively, to a pair of input terminals 236 and 237, a D.C. output voltage will appear across a pair of output terminals 238 and 239. The power absorbed at the input terminals 236 and 237 of a gallium arsenide light emitting diode (LED) 240 is converted to radiant light energy. This light energy is directed towards a large number of integrated circuit series-connected planar-silicon photovoltaic diodes 241, which generate the output voltage at the terminals 238 and 239. Since optical coupling is used, the input terminals 236 and 237 are electrically isolated from the output terminals 238 and 239. Optical isolation makes the device 234 particularly suitable for driving circuitry at the local ground level with circuitry at the reference ground level without establishing undesirable ground loop currents.

As shown in FIG. XVIII, the input terminals 236 and 237 are connected to the gallium arsenide LED 240 located within the device 235. The LED 240 is positioned above a large plurality of planar-silicon photovoltaic diodes 241 manufactured in integrated circuit fashion to be in electrical series between the output terminals 238 and 239. When a photovoltaic diode such as the diodes 241 is optically excited with sufficiently short-wave light energy, a small voltage will appear across its anode and cathode electrodes. The voltage across the individual diodes 241 is additive when the diodes 241 are connected in series, thereby producing a voltage across the terminals 238 and 239 equal to the sum of the voltages generated in the individual photovoltaic diodes 241.

The need to use many diodes to fit under one LED to achieve higher voltages requires each diode to be physically very small, thus causing a high internal impedance within the diodes 241 themselves. The high internal impedance of the diodes 241 limits the capabilities of the devices 235 to supply an output voltage to a low impedance load. However, such a limitation does not affect the suitability of the device 235 for use in MOSFET gate-drive circuitry such as that shown in FIG. XIII. As shown in FIG. XVIII, the output terminals 238 and 239 from the device 235 are connected, respectively, to the gate and the source contacts of a normally-off n-channel MOSFET 242. The output terminal 239 is also connected to a terminal 243 and the drain contact of the MOSFET 242 is connected to a terminal 244. As long as no power is applied to the input terminals 236 and 237, the MOSFET 242 will be non-conducting and a resistance on the order of about $10^{10}$ ohms will appear across the output terminals 243 and 244. When a D.C. voltage is applied to the input terminals 236 and 237 to excite the light emitting diode 240, the output voltage across the terminals 238 and 239 from the device 235 causes the MOSFET 242 to conduct, lowering the resistance between the terminals 243 and 244 typically to about 100 ohms. A zener diode 245 of proper polarity, as shown, may be connected between the terminals 238 and 239 from the device 235 to protect the gate circuit of the MOSFET 242 from destructive negative static electric high voltage accumulation. It is to be noted that the gate circuit of a typical MOSFET provides negligible load and may have a resistance on the order of $10^{12}$ ohms. As a consequence, the effective load across the output terminals 238 and 239 will be the very small internal surface leakage resistance of each photovoltaic diode 241 plus any small leakage resistance of the back-biased zener diode 245 connected across the output terminals 238 and 239.

Since the load on the device 235 is extremely small, the separate p-n junctions forming the diodes 241 may be on the order of only a few mils in diameter and may be fabricated using planar-silicon integrated circuit methods. Such methods permit mass production of the devices 235 at relatively low cost.

Turning to FIGS. XIX and XX, a fragmentary portion of a photovoltaic isolation device 235 formed by integrated circuit techniques is shown. The light emitting diode 240, which is not shown in these figures, illuminates an area generally represented by the fragment of a circle 246. The individual diodes are formed on an n-substrate material 247 and are located within the illuminated area 246. The diodes are formed on an upper surface 248 of the substrate 247. Using well-known mask-etched oxide window techniques to delineate each diode 241, in proper sequence, the p-regions 249 and the n-regions 250 are diffused into an n-type substrate 247. Then a device-grade oxide layer 252 is grown and mask-etched with final mask-etch metalization patterns 251 to complete the series interconnection pattern between the diodes 241.

It will be noted that the same general principle for photovoltaic generation of electricity has been used in the past in the so-called "solar cell". However, such cells were formed in large planar sheets typically several inches in arear for a single junction and great care had to be taken to obtain the low internal resistance necessary for maximum power transfer. Here, however, load impedance being well beyond the high megohm region permits efficiency considerations to be eliminated, and the photovoltaic isolation device 235 may be constructed with a large number of series connected diodes which are sufficiently small as to be illuminated by a single light emitting diode. In the more typical photoconductive optical couplers, an external power supply is required in the output circuit. Large junction size, permitting greater photoconduction currents, has usually been used. The junction size prevented a plurality of photovoltaic diodes from being incorporated under a single light emitting diode.

From the above description, it will be appreciated that the photovoltaic isolation device 235 may be used for replacing the D.C voltage source 142 and the combined voltage source 154 and photoconductive devices 148 and 149 in the circuit of FIG. XIII. Just as the oscillator 178, the Schmitt trigger 179, the flip-flop 144 and the AND gates 145 and 146 alternately excite the light emitting diodes 150 and 152 in the devices 148 and 149, respectively, the light emitting diodes 240 in two devices 235 may similarly be excited. In such an embodiment of the chopper 20', the output terminal 238 from one photovoltaic isolation device 235 may be connected directly to the gate contacts of the opposed MOSFETs 41 and 43 and the output terminal 238 from a second photovoltaic isolation device may be connected to the gate contacts of the opposed MOSFETs 42 and 44, while their negative output terminals 239 are attached to the common junction between resistors 155 and 156, without the need for the bulky, leakage-prone voltage source 154. When the light emitting diodes 240 in the two devices 235 are alternately excited, the opposed MOSFETs 41 and 43 and the opposed MOSFETs 42 and 44 will alternately conduct to chop or modulate a signal, as before.

In addition to providing optical isolation between the chopper 20' and the remote drive circuitry, a photovoltaic isolation device 235 may also be used as a voltage source for replacing the D.C. source 142 which back-biases the MOSFET substrates. Without the use of the device 235, such a D.C. source would have to be built using an isolating 60 Hz. transformer, a rectifying bridge, filter capacitors and a zener diode regulator, all of which are extremely bulky, costly and prone to limit remote chopper performance by leakage of the transformer. If a multiple p-n junction photovoltaic device similar to that shown in FIGS. XVIII–XX is permanently activated, it will generate a constant D.C. output voltage which may be used for back-biasing the substrates of the MOSFETs 41, 42, 43 and 44. The photovoltaic device 235 is ideal for generating the necessary back-bias voltage while maintaining at least $10^{12}$ ohms isolation from the reference ground. Also, there would be no need for providing 60 Hz. alternating current near the chopper 20' for operating the D.C. power source 142 or the D.C. power source 154 of the circuit of FIG. XIII, thus eliminating this source of electromagnetic flux which can add to the common-mode signal. Other applications of the photovoltaic device 235 involving the use of isolated linear gates in other types of circuitry would clearly be an improvement to that respective circuit art, for the above-stated reasons.

U.S. Pat. No. 3,366,802, which issued on Jan. 30, 1968 to Hilbiber, discloses a photo-chopper comprising a junction field effect transistor which is specially fabricated with a light sensitive surface in the gate vicinity. Electrical gating action between the two drain/source contacts in the JFET is achieved by directing light on the gate region, thereby causing the photovoltaic effect to develop an internal biasing voltage which turns off this normally-on JFET. The action attainable with the Hilbiber photo-chopper is similar to that attainable by the combination of the isolated photovoltaic device 235 with the normally off MOSFET 242, as shown in FIG. XVIII. The Hilbiber JFET photo-chopper can be substituted into the circuits of FIGS. II and XIII for the switching MOSFETs 41, 42, 43 and 44 and photodrive can be handled with reference-grounded logic, thereby maintaining the much needed electrical isolation from reference ground to the chopper circuit in a low-cost, but less than optimum version of the chopper bridge assembly. However, there are two problems with the use of these photo-chopper elements in this application. One is that they would afford less channel switch isolation while in the off condition. The other problem is that direct impingement of light on the same semiconductor material which is used to conduct the low-level signal would very likely lead to thermal instabilities causing electrical noise between the two drain/source contacts, thus limiting such a chopper assembly to a range considerably above one microvolt in sensitivity. In contradiction to these problems, the photovoltaically-driven MOSFET switch combination of FIG. XVIII would not be subject to these problems.

Accordingly, it will be readily understood that the balanced bridge chopper of this invention and its particular isolated connections to the square wave driving circuit may be fabricated in several different ways, and that other embodiments for forming the same function may be interchanged without departing from the scope of this invention. It will also be appreciated that the doping types for the transistors and the diodes can be reversed, i.d. p-semiconductor material may be substituted for n-semiconductor material and vise versa with similar results. It will further be appreciated that various other detailed modifications and changes may be made in the above-described principles of this invention without departing from the spirit and the scope of the following claims.

What I claim is:

1. A chopper circuit for modulating a low-level signal from a source located adjacent a local ground which is electrically displaced from a reference ground comprising, in combination, a balanced bridge chopper including four normally-off MOSFETs with the source/drain contact of a different MOSFET connected into each of four legs extending between four terminals to form a square configuration, one pair of opposed terminals defining bridge input terminals and the other pair of opposed terminals defining bridge outout terminals, means for applying such low-level signal to said input terminals for modulation, heat sink means mounting said input and output terminals and said MOSFETS, said heat sink means maintaining said terminals and said MOSFETs at substantially the same temperature, capacitive balancing means between at least one of said output terminals and the gates of the two adjacent MOSFETs connected to such output terminal for capacitively balancing said bridge chopper, means for alternatively driving opposing pairs of said MOSFETs such that while one pair of opposing MOSFETs are simultaneously conducting the other pair are non-conducting whereby a square wave A.C. signal proportional in magnitude to such low-level signal is applied to said bridge output terminals, and means for connecting said bridge output terminals to a signal receiver located adjacent the reference ground without changing the magnitude of the signal applied to such receiver by the displacement between the reference ground and the local ground.

2. A chopper circuit, as set forth in claim 1, wherein MOSFET driving means includes a square wave source located adjacent a reference ground which is spaced from the local ground, and means for driving said MOSFETs from the output of said square wave source including means for electrically isolating said balanced bridge chopper from the direct output of said square wave source whereby the output from said balanced bridge chopper is unaffected by the electrical ground displacement between said square wave source and said balanced bridge chopper.

3. A chopper circuit, as set forth in claim 2, wherein said isolating means includes a transformer having a primary winding and two shielded center tapped secondary windings, means applying the output of said square wave source to said primary winding, shielded cable means connecting said secondary winding center taps to different ones of said bridge input terminals and connecting the four ends of said secondary windings to different ones of the gates of the four MOSFETs with the ends of each secondary winding connected to the gates of the two MOSFETs connected to the bridge input terminal connected to the center tap for such secondary winding, a shield surrounding said balanced bridge chopper, and means connecting the shields for said secondary windings, said cable means and said balanced bridge chopper to the local ground.

4. A chopper circuit, as set forth in claim 2, wherein said isolating means includes two optical isolation devices each comprising a light source and output means responsive to light from said light source for establishing a D.C. voltage, and wherein said driving means includes means connecting said output means from one optical isolation device between said bridge input terminals and the gates of one opposed pair of said MOSFETs, means connecting said output means from the other optical isolation device between said bridge input terminals and the gates of the other opposed pair of said MOSFETs, and means for alternately energizing the light sources in said two optical isolation devices whereby such devices alternately generate sufficient D.C. voltages for alternately turning on said pairs of opposed MOSFETs connected to such devices.

5. A chopper circuit, as set forth in claim 4, wherein said output means from each of said optical isolation devices comprises a D.C. voltage source connected in series with a photoconductor located adjacent the light source for such device.

6. A chopper circuit, as set forth in claim 4, wherein said output means from each of said optical isolation devices comprising a plurality of series connected photovoltaic diodes.

7. A chopper circuit, as set forth in claim 6, wherein for each optical isolation device, said light source is a gallium arsenide light emitting diode and said plurality of series connected diodes are formed as a single planar-silicon integrated circuit with said diodes located to be simultaneously illuminated by said light emitting diode.

8. A chopper circuit, as set forth in claim 7, and including a third optical isolation device similar to said two optical isolation devices, means for continuously energizing the light emitting diode in said third device, and means connecting the output means from said third optical isolation device between said bridge input terminals and a common connection to the substrate of said four MOSFETs for back-biasing said substrates.

9. A chopper circuit, as set forth in claim 1, and further including means mounting said heat sink means adjacent the low-level signal source for thermal conductivity with such signal source.

10. A chopper circuit, as set forth in claim 9, and further including two trimmer capacitors, one connected between each of said bridge output terminals and the local ground, said two trimmer capacitors reducing the dominant frequency common-mode signal at said bridge output terminals.

11. A chopper circuit, as set forth in claim 10, and further including a balanced twin-tee low pass filter having input and output terminals, said filter resonating at the frequency of the dominant common-mode signal, and means connecting said filter input and output terminals in series between the low-level signal source and said bridge input terminals, said heat sink means including means mounting said filter terminals.

12. A chopper circuit, as set forth in claim 9, and further including a balanced twin-tee low pass filter having input and output terminals, said filter resonating at the frequency of the dominant commom-mode signal, and means connecting said filter input and output terminals in series between the low-level signal source and said bridge input terminals, said heat sink means including means mounting said filter terminals.

13. A chopper circuit, as set forth in claim 9, wherein said means for connecting said bridge output terminals to such receiver includes a locally grounded preamplifier having an input connected to said bridge output terminals and a balanced output connected to a shielded coaxial cable transmission line, said transmission line conducting the amplifier bridge output to such reference grounded receiver, and means connecting said transmission line shielding to the local ground.

14. A chopper circuit, as set forth in claim 9, wherein said means for connecting said bridge output terminals to such receiver includes a shielded coaxial cable transmission line connecting said bridge output terminals to such distant reference grounded receiver, and means connecting said transmission line shielding to the local ground.

15. A chopper circuit, as set forth in claim 1, wherein said four MOSFETs and said capacitive balancing means are formed as a single integrated circuit.

16. A chopper circuit, as set forth in claim 1, wherein said capacitive balancing means comprises a first capacitor connected between said one output terminal and the gate of one adjacent MOSFET connected to said one output terminal, and a second capacitor connected between said one output terminal and the gate of the other adjacent MOSFET connected to said one output terminal, and wherein said four MOSFETs and said first and second capacitors are formed as a single integrated circuit.

* * * * *

UNITED STATES PATENT OFFICE
CERTIFICATE OF CORRECTION

PATENT NO. : 3,995,174
DATED : November 30, 1976
INVENTOR(S) : Donald R. Zrudsky It is certified that error appears in the above-identified patent and that said Letters Patent are hereby corrected as shown below:

```
Column 2, line 56, "ot" should be -- of --.
Column 3, line 14, "priot" should be -- prior --.
Column 3, line 53, "impendance" should be -- impedance --.
Column 4, line 8, after "circuit", delete -- as --.
Column 4, line 21, after "twin-tee", insert -- input --.
Column 6, line 44, "portionn" should be -- portion --.
Column 7, line 28 "photovaltaic" should be -- photovoltaic --.
Column 10, line 39 "terminals" should be -- terminal --.
Column 15, line 60 "146" should be -- 46 --.
Column 16, line 21 "commonmode" should be -- common-mode --.
Column 17, line 2 "copper" should be -- chopper --.
Column 18, line 66 "cables" should be -- cable --.
Column 19, line 12 "ech" should be -- each --.
Column 19, line 14 "control" should be -- contact --.
Column 19, line 21 "224" should be -- 225 --.
Column 20, line 19 "234" should be -- 235 --.
Column 20, line 44 "devices" should be -- device --.
Column 21, line 35 "arear" should be -- area --.
Column 23, line 5 "i.d." should be -- i.e. --.
Column 23, line 18 "contact" should be -- contacts --.
Column 24, line 26 "comprising" should be -- comprises --.
Column 24, line 41 "substrate" should be -- substrates --.
Column 24, line 64 "commom-mode" should be -- common-mode --.
Column 25, line 7 "amplifier" should be -- amplified --.
```

Signed and Sealed this

Twenty-second Day of February 1977

[SEAL]

Attest:

RUTH C. MASON
Attesting Officer

C. MARSHALL DANN
Commissioner of Patents and Trademarks